(12) United States Patent
Hanaoka

(10) Patent No.: US 7,662,423 B2
(45) Date of Patent: Feb. 16, 2010

(54) METHOD FOR EJECTING LIQUID MATERIAL, METHOD FOR MANUFACTURING ORGANIC ELECTROLUMINESCENSE DEVICE, AND METHOD FOR MANUFACTURING COLOR FILTER

(75) Inventor: Hidetaka Hanaoka, Hara-Mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/119,127

(22) Filed: May 12, 2008

(65) Prior Publication Data

US 2008/0317941 A1 Dec. 25, 2008

(30) Foreign Application Priority Data

Jun. 21, 2007 (JP) .............................. 2007-163512

(51) Int. Cl.
*C23C 16/52* (2006.01)
*B05D 5/12* (2006.01)
*C23C 28/00* (2006.01)

(52) U.S. Cl. .......................... 427/8; 427/58; 427/421.1; 427/427.1; 427/162; 427/256; 347/8; 347/14; 347/16

(58) Field of Classification Search .................... 427/8, 427/58, 421.1, 427.1, 162, 256
See application file for complete search history.

(56) References Cited

U.S. PATENT DOCUMENTS

| 2004/0023567 | A1* | 2/2004 | Koyama et al. | .............. 439/894 |
| 2004/0104951 | A1* | 6/2004 | Shibata et al. | ................ 347/14 |

FOREIGN PATENT DOCUMENTS

| JP | A-2003-121631 | 4/2003 |
| JP | A-2004-058282 | 2/2004 |
| JP | A-2006-044059 | 2/2006 |

* cited by examiner

*Primary Examiner*—Shamim Ahmed
(74) *Attorney, Agent, or Firm*—Oliff & Berridge, PLC

(57) ABSTRACT

A method for ejecting a liquid material includes classifying the plurality of nozzles of a head into a plurality of nozzle groups having different landing position accuracies for droplets; and performing ejection includes main scanning for ejecting droplets of the liquid material through selected nozzles while generating relative movement in a main-scanning direction between the head and a target substrate, and sub-scanning for generating relative movement between the head and the target substrate in a sub-scanning direction orthogonal to the main-scanning direction. The main scanning and the sub-scanning are performed separately for each of the plurality of nozzle groups. During the sub-scanning, relative movement is generated in accordance with correction information for the corresponding nozzle group for correcting landing positions of the droplet. During the main scanning, a droplet is ejected through at least one nozzle selected from the corresponding nozzle group.

8 Claims, 14 Drawing Sheets

| G1 | G2 | G3 | G4 | G5 | G6 | G7 | G8 |
|----|----|----|----|----|----|----|----|
| 1 | 2 | 6 | 5 | 7 | 4 | 8 | 3 |
| 118 | 9 | 14 | 13 | 10 | 12 | 16 | 31 |
| . | 59 | 35 | 47 | 11 | 21 | 44 | . |
| . | . | . | . | . | . | . | . |
| . | . | . | . | . | . | . | . |
| | . | . | . | . | . | . | |
| | | 359 | | | | | |
| | | | | | | | |

METHOD FOR EJECTING LIQUID MATERIAL, METHOD FOR MANUFACTURING ORGANIC ELECTROLUMINESCENSE DEVICE, AND METHOD FOR MANUFACTURING COLOR FILTER

BACKGROUND

1. Technical Field

The present invention relates to methods for ejecting a liquid material containing a high-performance material. The invention also relates to methods for manufacturing an organic electroluminescence (EL) device and methods for manufacturing a color filter both using the aforementioned methods.

2. Related Art

In recent years, droplet ejecting methods (ink jet methods) have been attracting attention, in which devices such as metal wiring, light-emitting elements, and color filters are formed on a substrate by ejecting droplets of a liquid material containing a high-performance material onto the substrate in a drawing manner. In such droplet ejecting methods used in forming the aforementioned devices, a liquid material of a required volume can be provided in a required site (target position or region). From the viewpoint of resource and energy saving, for example, the droplet ejecting methods are highly notable.

The demand for accuracy in forming the aforementioned devices has been increasing. That is, it is required that droplets be ejected toward a substrate with a high landing position accuracy. For example, JP-A-2004-58282 discloses an ink jet recording method capable of controlling the droplet landing position. The method includes a nozzle-information generating step for generating nozzle information indicating ejection characteristics of nozzles on the basis of the landing state of ink droplets ejected through the nozzles onto a recording medium, an estimating step for estimating, on the basis of the nozzle information and recording data, the influence of the ejected ink droplets upon an image to be formed, a correction-information generating step for generating, on the basis of the result of the estimation, correction information for correcting the droplet ejection state of the nozzles, and a controlling step for controlling a nozzle driving operation on the basis of the recording data and the correction information.

In this ink jet recording method, a main scanning direction in which a recording head having a row of nozzles is moved over the recording medium while ejecting ink droplets is defined as the X direction, and a nozzle-row direction (sub-scanning direction) in which the nozzles are arranged is defined as the Y direction. Further, head correction is performed for nozzles that have caused errors in the droplet landing positions. In this head correction, unevenness in concentration caused by errors in the droplet landing positions is estimated in a virtual ideal recording matrix MT defined on the recording medium. Then, to correct the unevenness, a driving signal relating to the ejection operation using nozzles estimated to cause errors in the landing positions is controlled. Thus, the volume of ejection is changed, for example.

In such a head correcting method, however, it is still difficult to accurately control the droplet landing position. Landing position errors in the X direction are considered to be correctable by correcting the position of the recording head moving in the X direction, i.e., by correcting the nozzle position relative to the recording medium. However, no specific method for accurately controlling landing position errors in the nozzle-row direction (Y direction) has been described in JP-A-2004-58282.

SUMMARY

An advantage of some aspects of the invention is that it provides the following.

According to a first aspect of the invention, a method for ejecting a liquid material includes classifying the plurality of nozzles of a head into a plurality of nozzle groups having different landing position accuracies for droplets; and performing ejection includes main scanning for ejecting droplets of a liquid material through nozzles selected from the plurality of nozzles, while generating relative movement in a main-scanning direction between the head and a target substrate, and sub-scanning for generating relative movement between the head and the target substrate in a sub-scanning direction orthogonal to the main-scanning direction. The main scanning and the sub-scanning are performed separately for each of the plurality of nozzle groups. During the sub-scanning, relative movement between the head and the target substrate in the sub-scanning direction is generated in accordance with correction information for the corresponding nozzle group for correcting landing positions of the droplet. During the main scanning, a droplet is ejected through at least one nozzle selected from the corresponding nozzle group. Further, the main scanning is performed in such a manner that the droplets are ejected for one nozzle group at a time through at least one nozzle selected from the one nozzle group.

In this method, the ejection is performed in such a manner that, for each of the nozzle groups having different landing position accuracies of droplets, the relative positions of the substrate and the plurality of nozzles in the sub-scanning direction are corrected, and the main scanning is performed by using at least one selected nozzle. Therefore, even if the target regions are arranged with a high definition, droplets can be provided to the target regions with a high landing position accuracy. Accordingly, even with nozzles that do not meet the required level of landing position accuracy, a substantially high landing position accuracy can be realized.

In the first aspect of the invention, it is preferable that the plurality of nozzles be classified into the nozzle groups independently for each of the sub-scanning direction and the main-scanning direction.

By this method, droplets can be made to land with a high accuracy in both the sub-scanning direction and the main-scanning direction.

In the first aspect of the invention, it is preferable that the ejection be performed for each of the nozzle groups for the main-scanning direction in such a manner that the droplets are ejected with timings corrected in accordance with the correction information.

In this method, the landing positions of droplets are corrected in the main-scanning direction by adjusting the timing of ejection. Accordingly, droplets can be made to land with a high accuracy in the main-scanning direction while the substrate and the plurality of nozzles are moved relative to each other.

In the first aspect of the invention, it is preferable that the plurality of nozzles be classified by dividing a distribution of the landing positions of the droplets ejected through the plurality of nozzles into predetermined ranges so as to determine that nozzles corresponding to landing positions falling within a single predetermined range belong to a single nozzle group.

By this method, droplets can be made to land in the target regions with landing position accuracies within the respective predetermined ranges.

In the first aspect of the invention, it is preferable that the target regions be defined by a bank provided on the substrate in a pattern forming a matrix, and that the predetermined ranges be set in such a manner that the droplets to be ejected toward the target regions are kept from landing beyond the bank and flowing into an adjacent target region.

By this method, droplets can be kept from at least landing outside desired target regions. Accordingly, in the case where liquid materials of different kinds are ejected toward different target regions, the liquid materials can be prevented from being mixed together.

In the first aspect of the invention, it is preferable that the predetermined ranges be each smaller than or equivalent to half the size of the smallest width of the bank.

By this method, even if droplets are ejected in such a manner as to produce a post-landing diameter equivalent to the width of the target regions defined by the bank, the landing positions of the droplets fall within a range smaller than or equivalent to half the size of the smallest width of the bank. Accordingly, droplets can be made to land with a higher accuracy.

In the first aspect of the invention, it is preferable that the bank have a liquid-repellent surface.

By this method, even if droplets land on the bank, the droplets can be kept from remaining outside the target regions. Accordingly, a required volume of a liquid material in a form of droplets can be more assuredly provided to each target region.

In the first aspect of the invention, the method may further include acquiring nozzle information on the landing positions of the individual nozzles by causing the droplets ejected through the plurality of nozzles positioned to face an ejection target for landing-state observation to land along a virtual straight line extending on the ejection target.

In this method, by measuring the landing positions of the droplets that have landed along the virtual straight line on the ejection target, accurate information on the landing position of each nozzle can be acquired.

In the first aspect of the invention, it is preferable that the nozzle information be acquired by causing the droplets to land along the virtual straight line while moving the plurality of nozzles and the ejection target relative to each other under the same conditions as those in the main scanning.

By this method, landing position information based on the actual circumstances of droplet ejection toward the substrate can be acquired. This means that more appropriate landing position information can be acquired for each nozzle. The actual circumstances mentioned above means that conditions including the direction, forward or backward, of the relative movements, the speed of the relative movements, and the interval between the ejection target and the plurality of nozzles are set to the same values as those in the actual ejection. Particularly, the condition most influential on the droplet landing position needs to be the same as that in the actual ejection.

According to a second aspect of the invention, a method for manufacturing an organic electroluminescence device is provided. The organic electroluminescence device includes a plurality of light-emitting-layer regions defined on a substrate, the light-emitting-layer regions having at least corresponding light-emitting layers provided thereon. The method includes performing ejection in which a liquid material containing a light-emitting-layer material is ejected toward the light-emitting-layer regions by the method for ejecting a liquid material according to the first aspect of the invention, and curing the ejected liquid material to obtain the light-emitting layers.

By this method, even if the light-emitting-layer regions are arranged with a high definition on the substrate, a required volume of a liquid material in a form of droplets can be made to land on each light-emitting-layer region. This suppresses the occurrence of landing failure, whereby a high-definition organic EL device can be manufactured at a high yield.

According to a third aspect of the invention, a method for manufacturing a color filter is provided. The color filter includes a plurality of colored regions defined on a substrate, the colored regions having corresponding colored layers of at least three different colors provided thereon. The method includes performing ejection in which liquid materials of at least three different colors containing corresponding colorants are ejected toward the colored regions by the method for ejecting a liquid material according to the first aspect of the invention, and curing the ejected liquid materials to obtain the colored layers having the at least three different colors.

This method suppresses the occurrence of failure, such as color mixing due to landing failure, whereby a high-definition color filter can be manufactured at a high yield.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
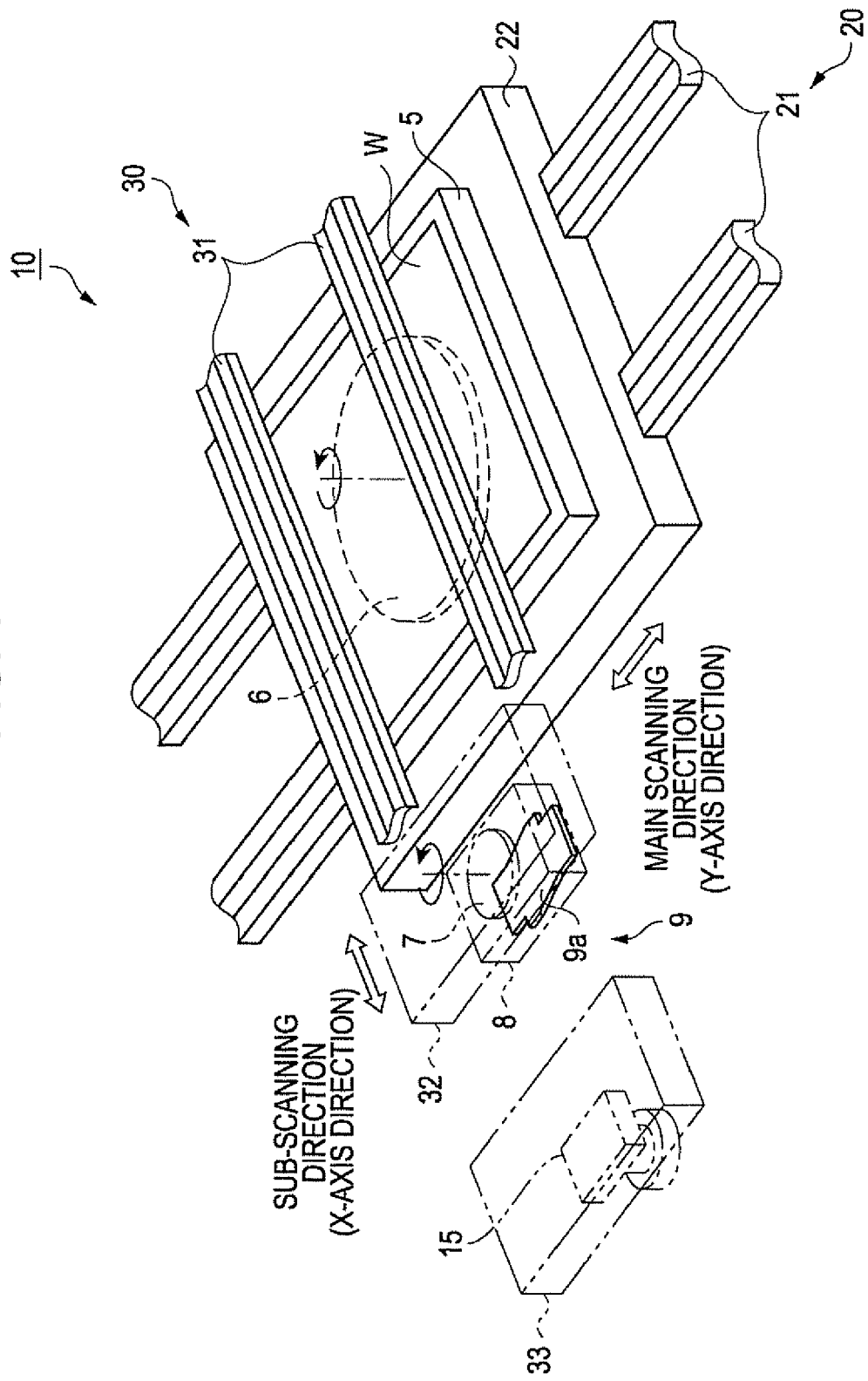
FIG. 1 is a schematic perspective view showing the configuration of a liquid ejecting apparatus.

Embodiments of the invention will now be described with reference to the accompanying drawings. The scales of components shown in the drawings are appropriately changed for easier recognition.

First Embodiment

Liquid Ejecting Apparatus

Referring to FIGS. 1 to 5, a liquid ejecting apparatus including a liquid ejecting head capable of ejecting a liquid material containing a high-performance material in a form of droplets will be described. FIG. 1 is a schematic perspective view of the liquid ejecting apparatus.

Referring to FIG. 1, a liquid ejecting apparatus 10 includes a workpiece moving mechanism 20 that moves a substrate W, a workpiece, in a main scanning direction (the Y-axis direction), and a head moving mechanism 30 that moves a head unit 9, on which liquid ejecting heads 50 (see FIG. 2) are mounted, in a sub-scanning direction (the X-axis direction).

The workpiece moving mechanism 20 includes a pair of guide rails 21, a movable base 22 that moves along the guide rails 21, and a set table 5 that is disposed on the movable base 22 with a θ table 6, which is a turnable mechanism, interposed therebetween. The substrate W is set on the set table 5. The movable base 22 moves in the main scanning direction with the aid of air sliders and linear motors (not shown) both provided in the guide rails 21. The set table 5 is capable of securely chucking the substrate W and accurately aligning a reference axis of the substrate W with respect to the main scanning direction or the sub-scanning direction in combination with the θ table 6.

The head moving mechanism 30 includes a pair of guide rails 31 and two movable bases 32 and 33 that move along the guide rails 31. The movable base 32 is provided with a carriage 8 hung therefrom with a turnable mechanism 7 interposed therebetween. The carriage 8 is provided with the head unit 9 having the liquid ejecting heads 50 mounted thereon. The carriage 8 is also provided with a liquid-material supplying mechanism (not shown) that supplies a liquid material to the liquid ejecting heads 50 and a head driver 48 (see FIG. 4) that controls an electrical driving operation of the liquid ejecting heads 50. The movable base 32 moves the carriage 8 in the X-axis direction, thereby positioning the head unit 9 opposite the substrate W.

The movable base 33 has a camera 15 as an image taking mechanism mounted thereon. The camera 15, which is carried by the movable base 33 in the X-axis direction, is capable of observing and taking an image of the landing state of droplets that have landed on the substrate W. According to need, an illuminating device for illuminating the object may also be provided on the movable base 33.

In addition to the above-described components, the liquid ejecting apparatus 10 includes a maintenance mechanism (not shown) that is disposed at a position accessible to the liquid ejecting heads 50 mounted on the head unit 9, for undertaking maintenance operations such as clearing of clogs in the nozzles and removal of foreign substances and contamination on the nozzle surfaces of the liquid ejecting heads 50.

Figure 2A:
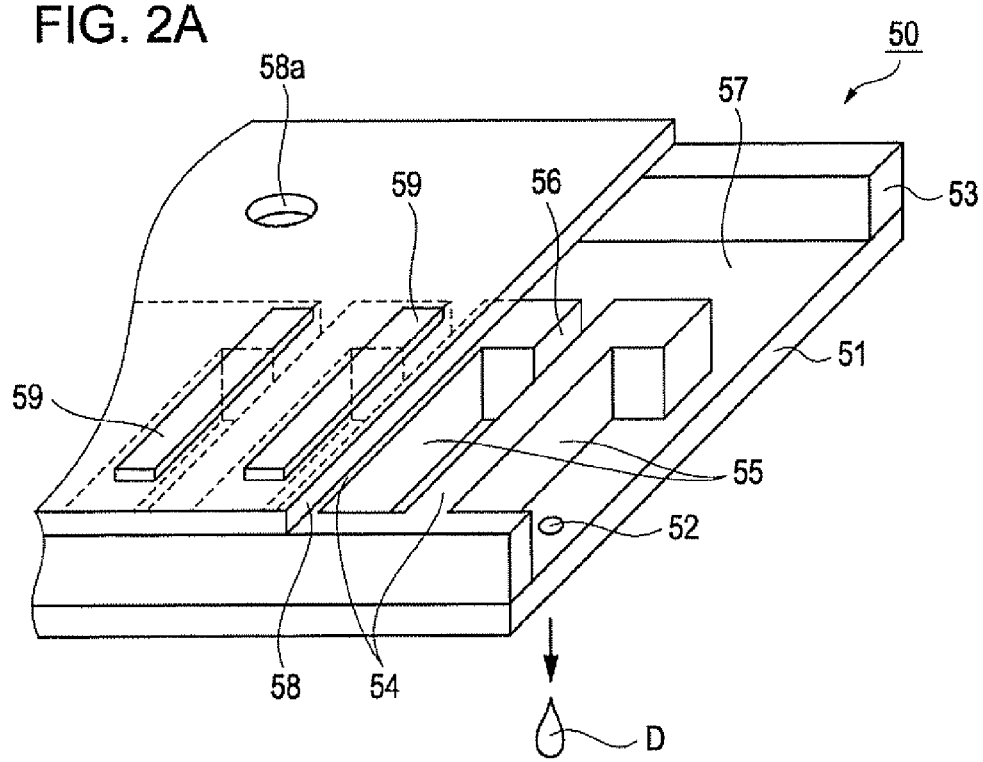
FIG. 2A is a schematic exploded perspective view of one of liquid ejecting heads.
Figure 2B:
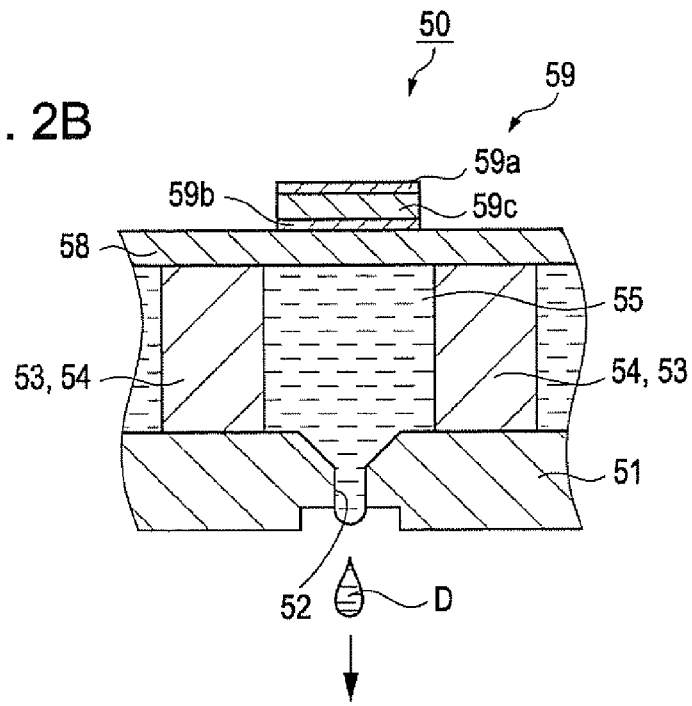
FIG. 2B is a cross-sectional view of relevant parts including one of nozzles.

FIGS. 2A and 2B schematically show the configuration of one of the liquid ejecting heads 50. FIG. 2A is a schematic exploded perspective view, and FIG. 2B is a cross sectional view of relevant parts including one of nozzles. The liquid ejecting head 50 has a structure including components stacked and bonded together one on top of another in the following order: a nozzle plate 51 having a plurality of nozzles 52 bored therein and through which droplets D are ejected, a cavity plate 53 serving as a set of partitions 54 that section cavities 55 communicating with corresponding nozzles 52, and a vibrating plate 58 on which vibrators 59 functioning as energy generators are provided in correspondence with the cavities 55.

In the cavity plate 53 functioning as the set of partitions 54 that section the cavities 55 communicating with the corresponding nozzles 52, channels 56 and 57 through which a liquid material is supplied into the cavities 55 are defined. The channel 57 is a space enclosed between the nozzle plate 51 and the vibrating plate 58 and functions as a reservoir in which the liquid material is stored.

The liquid material is supplied from the liquid-material supplying mechanism through a tube, flows into the reservoir through a supply port 58a bored in the vibrating plate 58, and reaches the cavities 55 via the channels 56.

Referring to FIG. 2B, each of the vibrators 59 functions as a piezoelectric device constituted by a piezoelectric element 59c held between a pair of electrodes 59a and 59b. When a driving voltage pulse is supplied from an external unit to the electrodes 59a and 59b, the vibrating plate 58, to which the vibrator 59 is bonded, is deformed. This increases the volume of the corresponding one of the cavities 55 sectioned by the partitions 54. Consequently, the liquid material is vacuumed from the reservoir into the cavity 55. When the supply of the driving voltage pulse is stopped, the vibrating plate 58 regains its original form, thereby pressurizing the liquid material in the cavity 55. In this manner, the liquid material can be ejected as droplets D through the nozzles 52. By controlling the driving voltage pulses supplied to the individual piezoelectric elements 59c, liquid-material ejecting operations for the individual nozzles 52 can be controlled.

The liquid ejecting heads 50 are not limited to those including piezoelectric devices, and may be those including electromechanical conversion devices that displace the vibrating plate 58 by utilizing electrostatic attraction or those including electrothermal conversion devices that heat the liquid material, thereby ejecting the liquid material in a form of droplets D through the nozzles 52.

Figure 3:
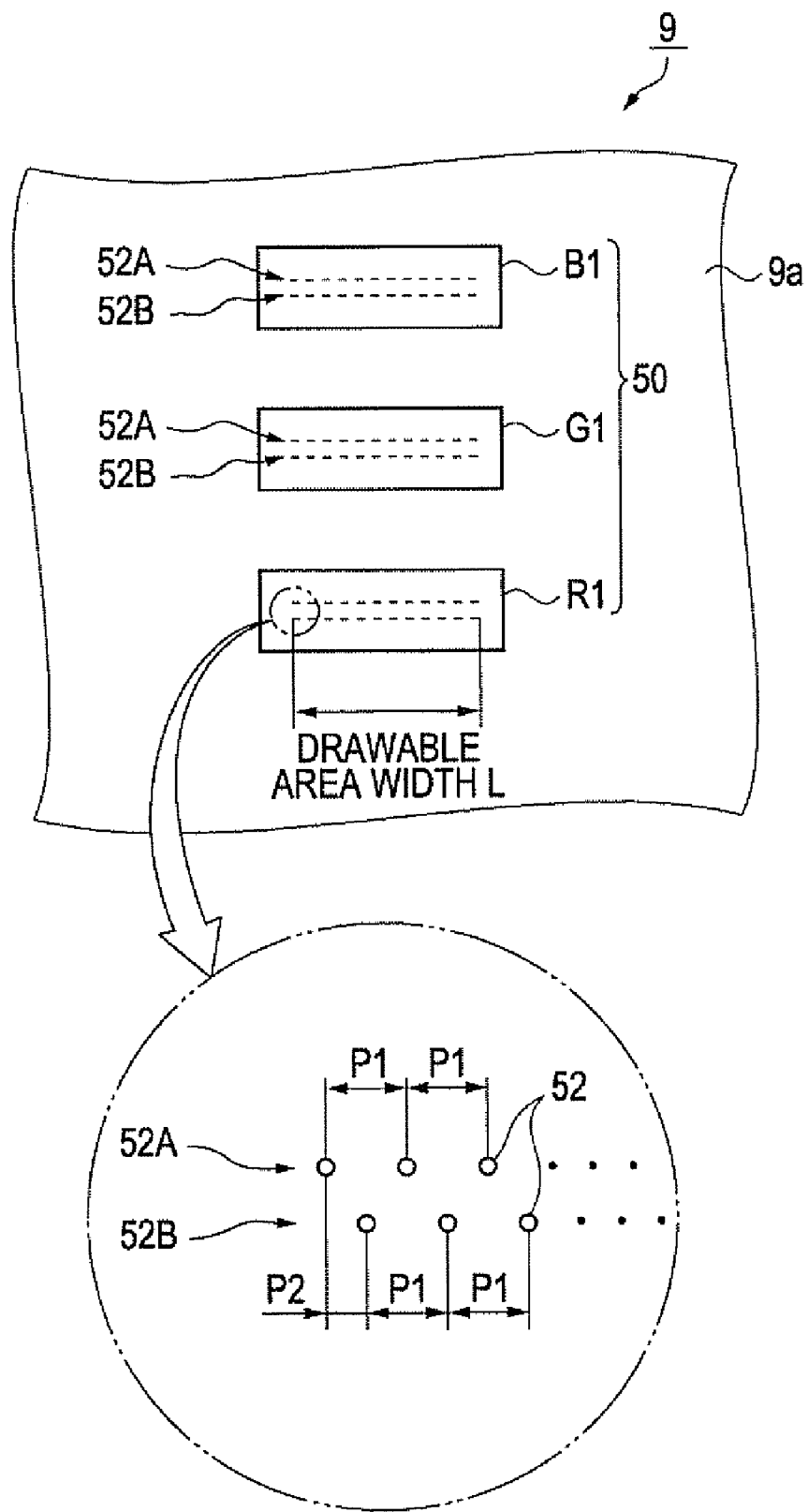
FIG. 3 is a schematic plan view showing the arrangement of the liquid ejecting heads provided on a head unit.

FIG. 3 is a schematic plan view showing the arrangement of the liquid ejecting heads 50 provided on the head unit 9, seen from below the set table 5 (see FIG. 1).

Referring to FIG. 3, the head unit 9 has a head plate 9a for mounting a plurality of the liquid ejecting heads 50. In the first embodiment, three liquid ejecting heads 50 are disposed on the head plate 9a. The three liquid ejecting heads 50 (R1, G1, and B1) can eject different liquid materials.

Each of the liquid ejecting heads 50 has two nozzle rows 52A and 52B each having a plurality (180) of the nozzles 52 aligned at an almost constant interval (a nozzle pitch P1 of about 140 μm). The nozzle rows 52A and 52B in the nozzle plate 51 are staggered from each other by a nozzle pitch P2, which is half the size of the nozzle pitch P1. Therefore, when seen in a direction orthogonal to the nozzle rows 52A and 52B, the nozzles 52 are practically arranged at a pitch of about 70 μm which is the nozzle pitch P2. Each nozzle 52 has a diameter of about 20 μm. A width of an area drawable with a single liquid ejecting head 50 is defined as a drawable area width L, which also represents an effective length of the nozzle rows 52A and 52B.

In the first embodiment, the liquid ejecting heads 50 (R1, G1, and B1) are arranged parallel to each other on the head plate 9a.

The arrangement of the liquid ejecting heads 50 on the head plate 9a is not limited that mentioned above. Moreover, the number of nozzle rows provided in each liquid ejecting head 50 is not limited to two, and may be one or three or more.

Figure 4:
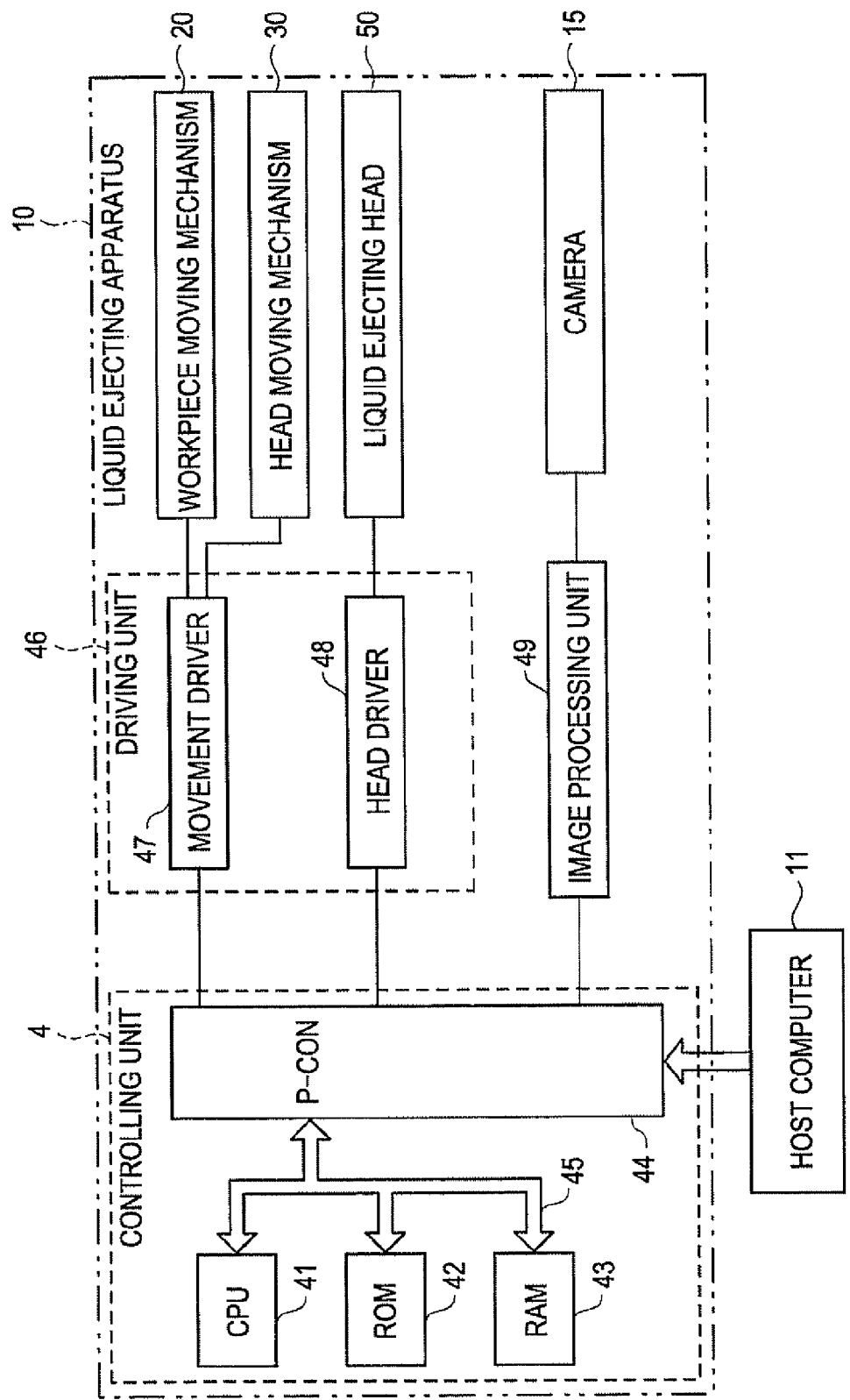
FIG. 4 is a block diagram showing a control system of the liquid ejecting apparatus.

Next, a control system of the liquid ejecting apparatus 10 will be described. FIG. 4 is a block diagram showing the control system of the liquid ejecting apparatus 10. The control system of the liquid ejecting apparatus 10 includes a driving unit 46 having drivers that drives the liquid ejecting heads 50, the workpiece moving mechanism 20, the head moving mechanism 30, and the like; and a controlling unit 4 that controls the entirety of the liquid ejecting apparatus 10 including the driving unit 46. Additionally, the control system includes an image processing unit 49, to which the camera 15 is connected.

The driving unit 46 includes a movement driver 47 that controls operations for driving the respective linear motors of the workpiece moving mechanism 20 and the head moving mechanism 30, a head driver 48 that controls the ejection operation of the liquid ejecting heads 50, and a maintenance driver (not shown) that controls an operation for driving maintenance units of the maintenance mechanism.

The controlling unit 4 includes a central processing unit (CPU) 41, a read-only memory (ROM) 42, a random access memory (RAM) 43, and a peripheral control circuit (P-CON) 44, all of which are mutually connected by a bus 45. A host computer 11 is connected to the P-CON 44. The ROM 42 has a control program area in which control programs to be processed by the CPU 41, for example, are stored, and a control data area in which control data used for performing a drawing operation and a function recovering operation, for example, is stored.

The RAM 43 has various storage units such as a drawing data storage unit that stores drawing data for performing drawing on the substrate W and a positional data storage unit that stores positional data on the substrate W and the liquid ejecting heads 50 (nozzles 52, practically). The RAM 43 is used as an area in which various control operations are performed. The P-CON 44 is connected with the drivers included in the driving unit 46 and with the image processing unit 49. The P-CON 44 provides functions supplementary to those of the CPU 41, and includes a logic circuit for processing interface signals used for transaction with peripheral circuits.

Thus, the P-CON 44 transmits various commands, which are unprocessed or processed by the P-CON 44, from the host computer 11 to the bus 45. Further, in cooperation with the CPU 41, the P-CON 44 outputs to the driving unit 46 data and control signals, which are unprocessed or processed by the P-CON 44, that are output from the CPU 41, for example, to the bus 45.

The CPU 41 inputs via the P-CON 44 various detection signals, commands, and data to corresponding components in accordance with the control programs stored in the ROM 42. After processing the data stored in the RAM 43, the CPU 41 outputs various control signals via the P-CON 44 to the driving unit 46 and other components. Thus, the CPU 41 controls the entirety of the liquid ejecting apparatus 10. Specifically, the CPU 41 controls the liquid ejecting heads 50, the workpiece moving mechanism 20, and the head moving mechanism 30. Under the control of the CPU 41, drawing is performed in the following manner: The liquid ejecting heads 50 and the substrate W are positioned to face each other. Then, synchronously with relative movements of the liquid ejecting heads 50 and the substrate W, a liquid material is ejected in a form of droplets D through the nozzles 52 of the liquid ejecting heads 50 toward the substrate W. In the first embodiment, an operation for ejecting a liquid material synchronously with the movement of the substrate W in the Y-axis direction is called main scanning, and an operation for moving the head unit 9 having the liquid ejecting heads 50 mounted thereon in the X-axis direction is called sub-scanning. The liquid ejecting apparatus 10 according to the first embodiment can perform drawing in the liquid material during an ejection operation in which the main scanning and the sub-scanning are repeated a plurality of times. The main scanning is not limited to be performed by moving the substrate W in a one-way manner across the liquid ejecting heads 50, and may be performed by moving the substrate W back and forth.

The CPU 41 also causes the head moving mechanism 30 to move the movable base 33 in the X-axis direction so that the camera 15 mounted on the movable base 33 is positioned to face the substrate W. Thus, the state of droplets D that have landed on the surface of the substrate W is observed while the image of the droplets D is taken. Such positional information obtained by moving the camera 15 with respect to the substrate W is generated by the host computer 11 and is input beforehand to the RAM 43 as observation coordinates. The image processing unit 49 is connected via the P-CON 44 to the host computer 11. The host computer 11 can display on a display unit information on an image taken by the camera 15 and converted by the image processing unit 49. Thus, an operator can check the landing state of droplets D.

The image processing unit 49 converts the taken image showing the landing state of the droplets D into bitmap data. The CPU 41 can calculate the displacement in the landing position of a droplet D and the post-landing diameter of a droplet D on the basis of this bitmap data. The result of the calculation is written in the RAM 43 and, almost at the same time, is output to the host computer 11 as nozzle information and stored in a storage unit thereof. If any nozzles 52 are clogged and fail to eject droplets D, the state of such a failure is taken as an image and stored as nozzle information in the storage of the host computer 11 in the aforementioned manner. Details will be given in the description for a method for ejecting a liquid material.

In the above-described liquid ejecting apparatus 10, when a liquid material is provided in a form of droplets D in target regions sectioned on the substrate W, it is necessary to control not only the landing positions of the droplets D but also the volumes of the droplets D to be ejected so that the droplets D can have preferable post-landing diameters.

Figure 5:
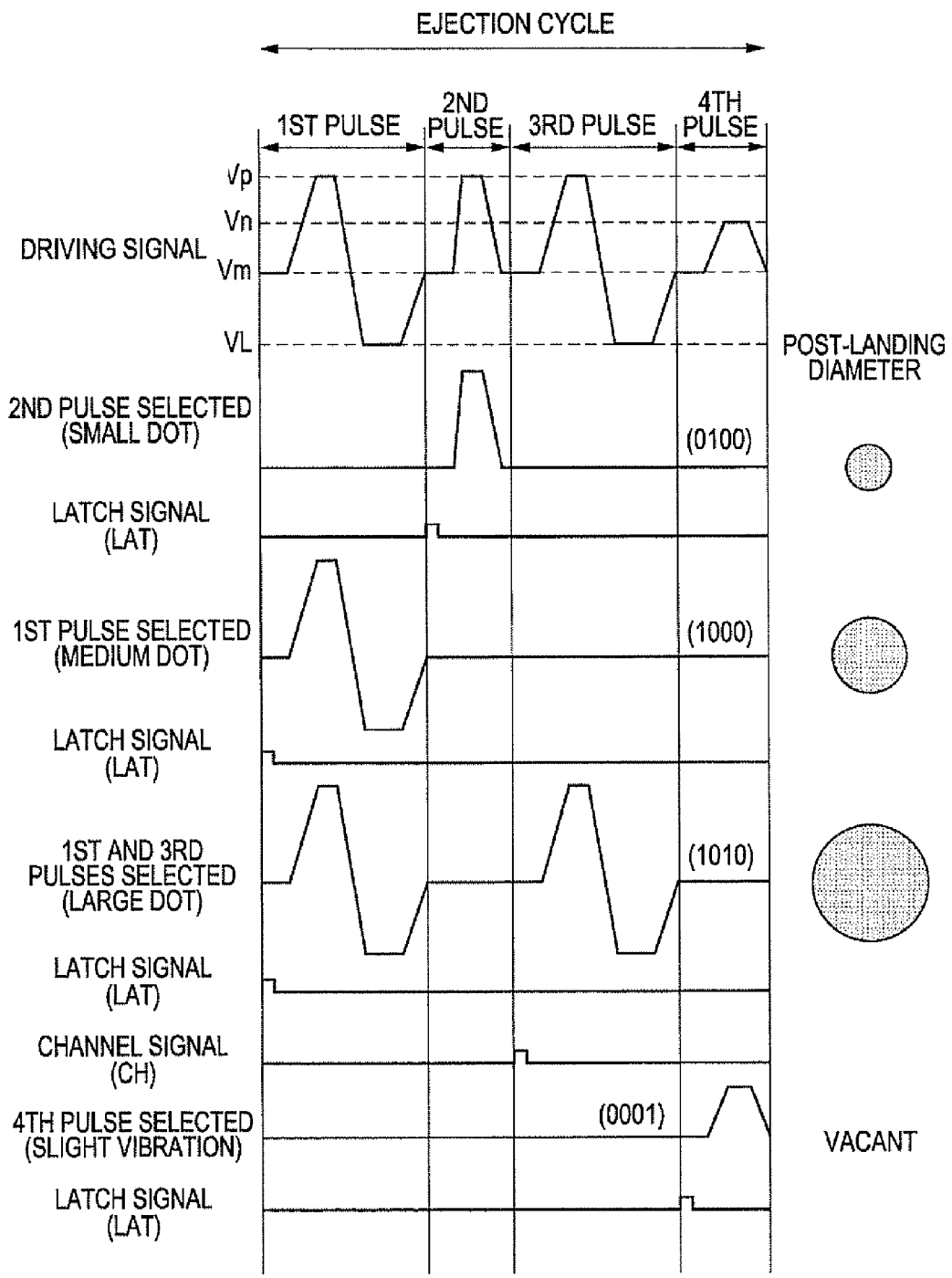
FIG. 5 is an exemplary timing chart showing a driving signal (pulses) that is output from a head driver to each liquid ejecting head.

FIG. 5 is an exemplary timing chart showing a driving signal (pulses) that is output from the head driver 48 to each liquid ejecting head 50. For example, the controlling unit 4 can cause the liquid ejecting head 50 to eject droplets D that would have different post-landing diameters, by outputting a control signal that instructs the head driver 48 to select one or two of four kinds of pulses contained in the driving signal generated by the head driver 48.

The head driver 48 can generate a driving signal in which a sequential set of a first pulse, a second pulse, a third pulse, and a fourth pulse is defined as a single ejection cycle. The first pulse is a rectangular driving signal the level of which changes, relative to a reference voltage Vm, between a maximum driving voltage Vp and a minimum driving voltage VL having a polarity different from that of the maximum driving voltage Vp. The second pulse is a driving signal the level of which changes between the reference voltage Vm and the maximum driving voltage Vp. The third pulse is the same driving signal as the first pulse. The fourth pulse is a driving signal the level of which changes between the reference voltage Vm and a medium voltage Vn. When these driving signals having different voltage waveforms are supplied to each vibrator 59 (see FIGS. 2A and 2B), the size of deformation in the vibrating plate 58 having the vibrator 59 bonded thereto changes. This changes the pressure applied to the liquid material in the cavity 55 (see FIGS. 2A and 2B). Thus, the volume of a droplet D to be ejected can be changed.

To eject a droplet D that would have a post-landing diameter to form a small dot in accordance with the drawing data, the controlling unit 4 sets the bitmap data, which is four-bit data, to (0100). On the basis of this bitmap data, the controlling unit 4 outputs to the head driver 48 a latch signal that causes the head driver 48 to supply a corresponding driving signal (pulse) to the vibrator 59 corresponding to a desired one of the nozzles 52. In response to this, the head driver 48 supplies the second pulse selected in accordance with the bitmap data (0100) to the piezoelectric element 59c corresponding to the desired nozzle 52. Likewise, when the bitmap data is set to (1000), the first pulse is selected, whereby a droplet D that would have a post-landing diameter to form a medium dot is ejected. When the bitmap data is set to (1010), the first and third pulses are selected. In this case, the latch signal is used to supply the first pulse, whereby a droplet D that would form a medium dot is ejected. Subsequently, for the same nozzle 52 and at the same position, a channel signal is used to supply the third pulse, whereby another droplet D that would form a medium dot is ejected. The two overlappingly ejected medium-dot droplets D together form a large dot. When the bitmap data is set to (0001), the fourth pulse is selected. Supplying the fourth pulse to the vibrator 59 causes no ejection of a droplet D (a vacant dot space). The fourth pulse has the medium voltage Vn so that the vibrator 59 causes the vibrating plate 58, to which the vibrator 59 is bonded, to apply to the liquid material a pressure that slightly vibrates the meniscus of the liquid material formed in the nozzle 52. Therefore, by applying the fourth pulse to the vibrator 59 corresponding to one of the nozzles 52 that is not required for ejection of the liquid material, the meniscus of the liquid material formed in that nozzle 52 is slightly vibrated, whereby clogging of the nozzle 52 can be prevented.

As described above, when drawing data is configured such that one-bit data is allocated to each of the driving pulses (driving signals), only a desired driving pulse can be selected in accordance with the values of the bits. This one-bit data allocated to each of the driving pulses functions as a "pulse selecting signal". If the fourth pulse needs to be omitted, it is only necessary to translate the four-bit data into three-bit data in the following manner, for example: the vacant dot space is defined as (000), the small dot is defined as (010), the medium dot is defined as (100), and a large dot formed of two medium dots is defined as (101).

With the liquid ejecting apparatus 10 described above, the volumes of droplets D to be ejected can be controlled in such a manner that the droplets D would have preferable post-landing diameters in accordance with the sizes, shapes, and arrangement of target regions to which the droplets D of a liquid material is provided. It should be noted that the post-landing diameter depends on not only the volumes of droplets D to be ejected but also physical properties (viscosity and surface tension) of the liquid material and the surface condition (interfacial tension) of the substrate W, the target of ejection. Therefore, the volumes of droplets D need to be controlled considering such characteristics.

Method for Ejecting Liquid Material

Figure 6A:
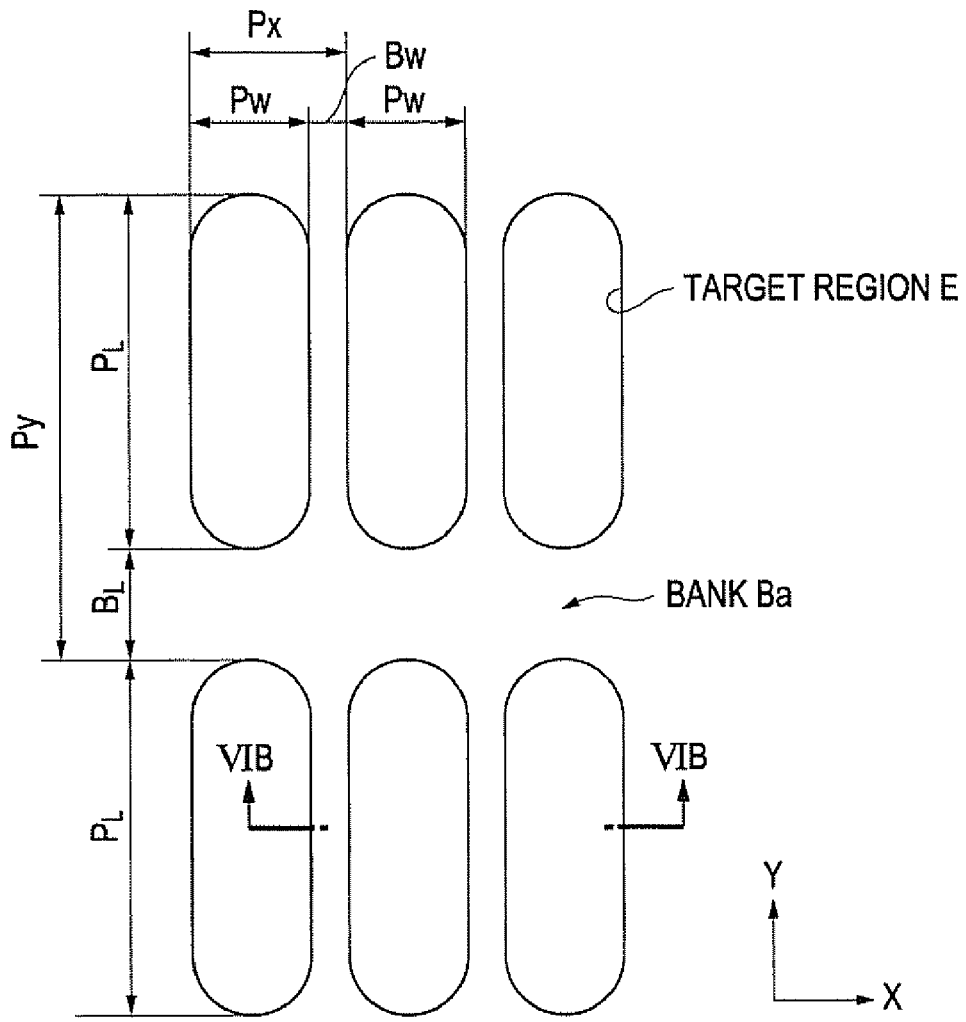
FIG. 6A is a schematic plan view of target regions provided on a substrate.
Figure 6B:
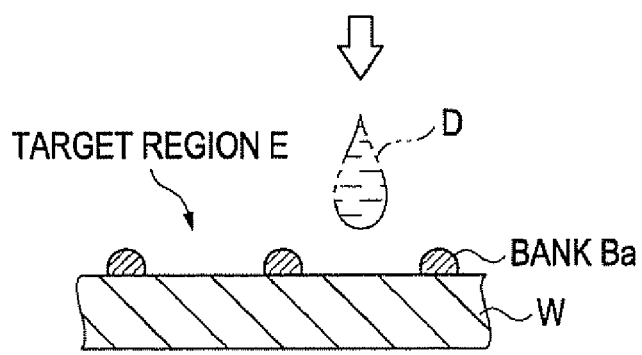
FIG. 6B is a schematic cross-sectional view taken along the line VIB-VIB in FIG. 6A.

A method for ejecting a liquid material according to the first embodiment will now be described with reference to FIGS. 6A to 13B. FIGS. 6A and 6B are a schematic plan view and a schematic cross-sectional view, respectively, showing target regions on the substrate W. The cross-sectional view in FIG. 6B is taken along the line VIB-VIB in FIG. 6A.

Referring to FIG. 6A, a plurality of target regions E are defined on the substrate W in the X- and Y-axis directions, thereby forming a matrix. The target regions E are defined by a bank Ba and each of the target regions E has a round shape elongated in the Y-axis direction. The Y-axis ends of the target regions E are round so as to allow for droplets D that would spread after landed.

The bank Ba is desirably liquid-repellent at least on a surface (landing surface) thereof. Because of the liquid-repellent landing surface, even if a droplet D lands on the bank Ba, the liquid material (the droplet D) will not remain on the bank Ba outside the target regions E. The bank Ba is formed in the following manner, for example: A liquid-repellent photosensitive resin material is applied on a surface of the substrate W, and photolithographic exposure and development are performed thereon. If a non-liquid-repellent photosensitive resin material is used, the surface of the material applied as the bank Ba is processed with a fluorine-based gas, whereby the surface can have liquid-repellency.

The arrangement of the target regions E on the substrate W needs to be designed with a high accuracy. Exemplary dimensions in designing the arrangement of the target regions E as elements constituting pixels of a display apparatus with a density of 400 pixels per inch (ppi) on the substrate W are as follows: An X-axis arrangement pitch Px is 21 μm, and an X-axis width Pw is 16 μm. Consequently, an X-axis width Bw of the bank Ba is 5 μm. A Y-axis arrangement pitch Py of the target regions E is 63 μm, and a Y-axis width PL is 48 μm. Consequently, a Y-axis width BL of the bank Ba is 15 μm. In this arrangement, the opening rate of the target regions E is about 18%. To increase the opening rate, the widths Bw and BL of the bank Ba need to be reduced, of course. The height of the bank Ba is determined according to the total volume of the liquid material to be provided in each target region E. In the first embodiment, the height of the bank Ba is set to about 2 to 3 μm.

In such a fine arrangement of the target regions E, even a slight displacement in the landing position of a droplet D may cause the droplet D to land beyond the bank Ba. Consequently, part of the droplet D may flow into an adjacent target region E. That is, a required volume of the liquid material may not be provided in a desired target region E. As a prevention for such a problem, an ejection condition needs to be set that droplets D are ejected such as to land substantially in the centers of the target regions E, as shown in FIG. 6B.

Even if droplets D are successively ejected to land substantially in the centers of the target regions E, the same problem as described above may still occur when the post-landing diameters of the droplets D are too large. However, the volumes of droplets D to be ejected are controllable as described above. Therefore, the latter problem can be solved rather easily.

In contrast, it is very difficult to solve the problem relating to the landing position accuracy. Each liquid ejecting head 50 has 360 nozzles 52 in total (two nozzle rows each including 180 nozzles 52). It is difficult to maintain high landing position accuracy of droplets D for all of the nozzles 52.

Therefore, in the first embodiment, the landing state of ejected droplets D is observed and analyzed for each of the nozzles 52, whereby ejection characteristics of the individual nozzles 52 are acquired as nozzle information (a nozzle-information acquiring step).

Figure 7A:
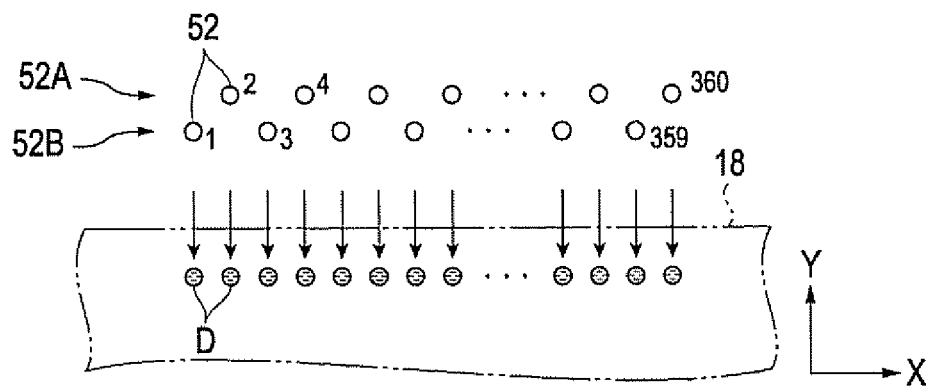
FIG. 7A is a schematic plan view showing an exemplary method for acquiring nozzle information.
Figure 7B:
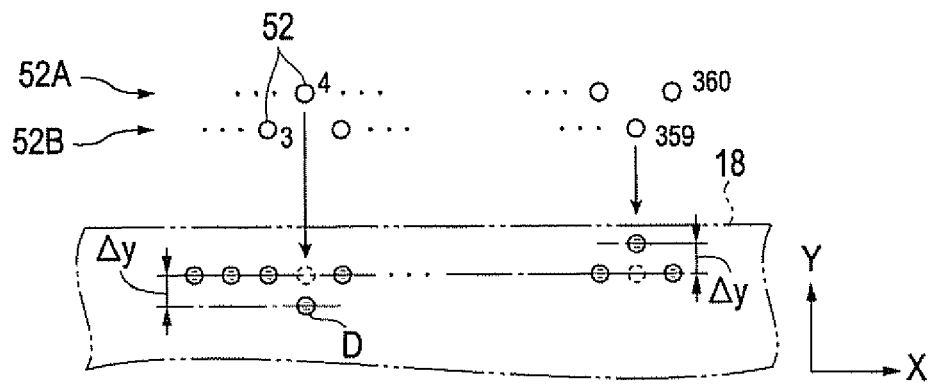
FIG. 7B is another schematic plan view showing the exemplary method for acquiring nozzle information.
Figure 7C:
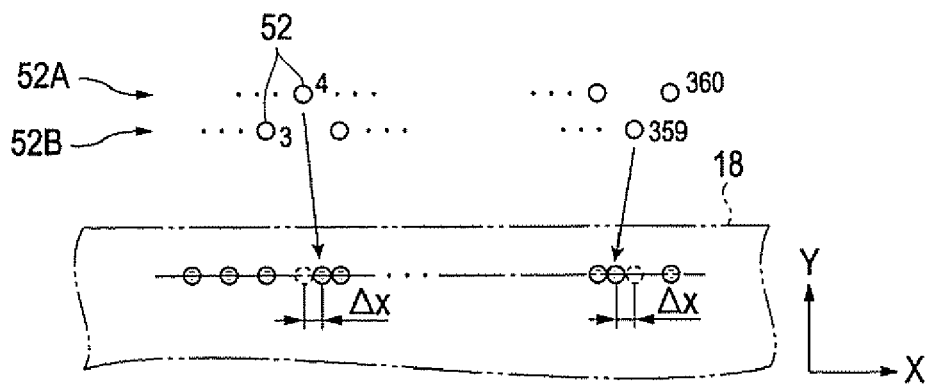
FIG. 7C is another schematic plan view showing the exemplary method for acquiring nozzle information.

FIGS. 7A to 7C are schematic plan views showing an exemplary method for acquiring nozzle information. Referring to FIG. 7A, a recording paper 18 used as an ejection target for observation of the landing state is placed on the set table 5 of the liquid ejecting apparatus 10 (see FIG. 1). Ejection is performed in such a manner that droplets D of the same kind are ejected through the nozzles 52 of each liquid ejecting head 50 and land along a virtual straight line extending in the sub-scanning direction (X-axis direction). Specifically, the controlling unit 4 controls the timings of ejection through the respective nozzle rows 52A and 52B while causing the head unit 9 and the set table 5 to move relative to each other in such a manner that the ejected droplets D land along the virtual straight line. Then, the state of the droplets D that have landed on the recording paper 18 is observed with the camera 15. If there is no failure in the ejection of the droplets D through the nozzle rows 52A and 52B, all of the droplets D land along the virtual straight line. Further, if the volumes of the ejected droplets D are substantially the same for all of the nozzles 52, the post-landing diameters of all of the droplets D are substantially the same.

For example, referring to FIG. 7B, if the nozzle rows 52A and 52B include any nozzles 52 whose flight paths are deflected in the main scanning direction (Y-axis direction), the droplets D that have ejected through such nozzles 52 land on positions deviating from the virtual straight line. By taking and processing the image of such a landing state, the CPU 41 calculates a displacement $\Delta y$. FIG. 7B shows an exemplary case where droplets D ejected through the nozzles 52 numbered 4 and 359 apparently land on positions deviating from the virtual straight line. In the first embodiment, the CPU 41 calculates the displacement $\Delta y$ for each of the nozzles 52. The results of the calculation are stored as nozzle information in the RAM 43 and the storage unit of the host computer 11.

Likewise, referring to FIG. 7C showing another exemplary case, if the nozzle rows 52A and 52B include any nozzles 52 whose flight paths are deflected in the sub-scanning direction (X-axis direction), the droplets D that have ejected through such nozzles 52 land along the virtual straight line at irregular intervals. By taking and processing the image of such a landing state, the CPU 41 calculates a displacement $\Delta x$. FIG. 7C shows an exemplary case where droplets D ejected through the nozzles 52 numbered 4 and 359 apparently land at irregular intervals. In the first embodiment, the CPU 41 calculates the displacement $\Delta x$ for each of the nozzles 52. The results of the calculation are stored as nozzle information in the RAM 43 and the storage unit of the host computer 11.

Needless to say, the landing position may also deviate in an oblique direction, not only in the exact main scanning (Y-axis) direction or in the exact sub-scanning (X-axis) direction. Therefore, the two kinds of displacements, i.e., the displacement $\Delta x$ in the sub-scanning direction and the displacement $\Delta y$ in the main scanning direction, are separately calculated for each nozzle 52. The size of the displacement in the landing position of a droplet D ejected through a nozzle 52 whose flight path is deflected may vary depending on the directions of relative movements of the liquid ejecting head 50 (nozzles 52) and the ejection target. Therefore, it is desirable to observe the landing state by performing ejection while moving the recording paper 18 back and forth in the main scanning direction with respect to the head unit 9, which has the liquid ejecting heads 50 mounted thereon, in such a manner that droplets D land on two different virtual straight lines provided respectively for forward movement and backward movement. Further, the speeds of the relative movements of the head unit 9 and the recording paper 18 are desirably the same as those in the actual ejection of droplets D onto the substrate W. To acquire nozzle information based on the actual circumstances of liquid material ejection, the above-described observation of the landing state needs to be performed repeatedly, whereby major parameter values (such as the average and the median) representing ejection characteristics (landing position accuracy) of each nozzle 52 are acquired and used for correction.

Although, in the first embodiment, nozzle information is acquired for 360 nozzles 52 in total considering the two nozzle rows 52A and 52B as a single set of nozzle rows, nozzle information may also be acquired for each nozzle row constituted by 180 nozzles 52. In that case, droplets D can be ejected without the relative movements of the liquid ejecting head 50 and the recording paper 18, whereby the droplets D can be made to land along two different virtual straight lines extending in the sub-scanning direction.

In some cases, the liquid ejecting head 50 (nozzle rows 52A and 52B) may be turned by an angle with respect to the main scanning direction when being positioned to face the substrate W. For such a case, of course, the liquid ejecting head 50 only needs to be turned by the same angle when being positioned to face the recording paper 18. Then, the timings of ejection through the individual nozzles 52 are controlled while the liquid ejecting head 50 and the recording paper 18 are moved relative to each other. Thus, droplets D can be made to land along a virtual straight line extending in the sub-scanning direction.

Moreover, the ejection target used for observation of the landing state is not limited to the recording paper 18, and may be the substrate W. When the substrate W is used, the same interval between the liquid ejecting head 50 and the substrate W as that in the case of the actual ejection of droplets D onto the substrate W can be produced. That is, it is unnecessary to adjust the aforementioned interval considering the thickness of the recording paper 18. Accordingly, correct nozzle information can be obtained.

Such observation of the landing state provides not only information on landing position accuracy of droplets D but also information such as ejection failure due to clogging of the nozzles 52 and the difference in post-landing diameter from the desired value. Such pieces of information can also be used as nozzle information.

Figure 8:
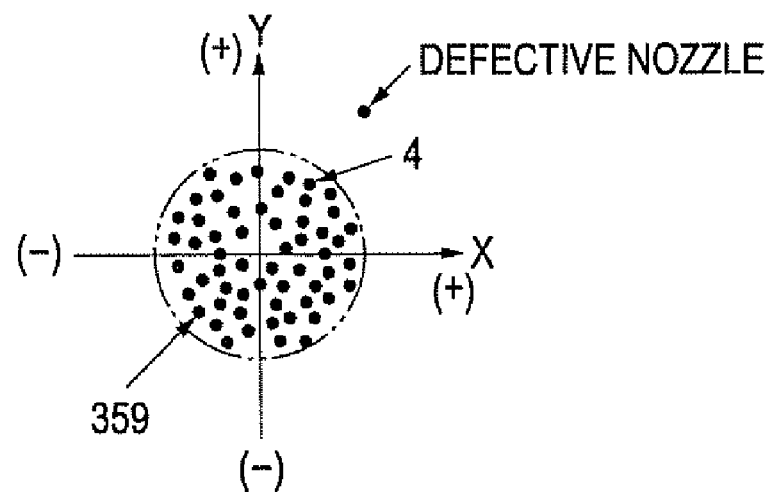
FIG. 8 is a graph showing the landing position accuracy of droplets ejected through the individual nozzles.

FIG. 8 is a graph showing the landing position accuracy of droplets D ejected through the individual nozzles 52. It is understood from FIG. 8 that the landing positions of droplets D ejected through the nozzles 52 are mostly plotted within a regularly shaped region (a circle in FIG. 8). If any nozzles 52 have failure such as clogging, irregular values may be found as defective nozzles, of course. When droplets D are ejected through the nozzles 52 that are normal, the landing positions of the droplets D can be regarded as a set of values distributed within a certain range. Possible causes of this distribution include variations in position and shape of the nozzles 52, and variations in ejection speed of droplets D due to variations in characteristics of the vibrators 59.

When an ink jet head included in an ink jet printer serving as a recording apparatus is industrially used, the landing positions are distributed within a circle of about φ20 μm, although the diameter of this circle varies with physical properties of the liquid material to be used. However, to eject droplets D toward the target regions E arranged at a density of 400 ppi under the conditions including the above-described distribution, it is difficult to accurately make the droplets D land within the target regions E. To avoid this, the method for ejecting a liquid material according to the first embodiment includes a feature in which the nozzles 52 are classified into groups of nozzles (nozzle groups) in accordance with the landing position accuracy of droplets D (a nozzle classifying step).

Figure 9:
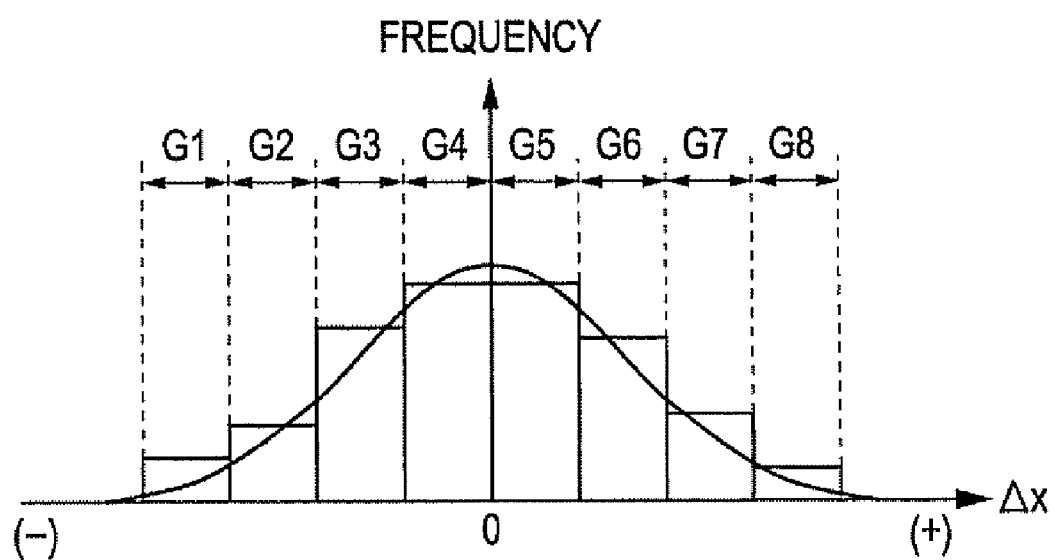
FIG. 9 is a graph showing the distribution of droplet landing positions in the sub-scanning direction.
Figures 10, 11:
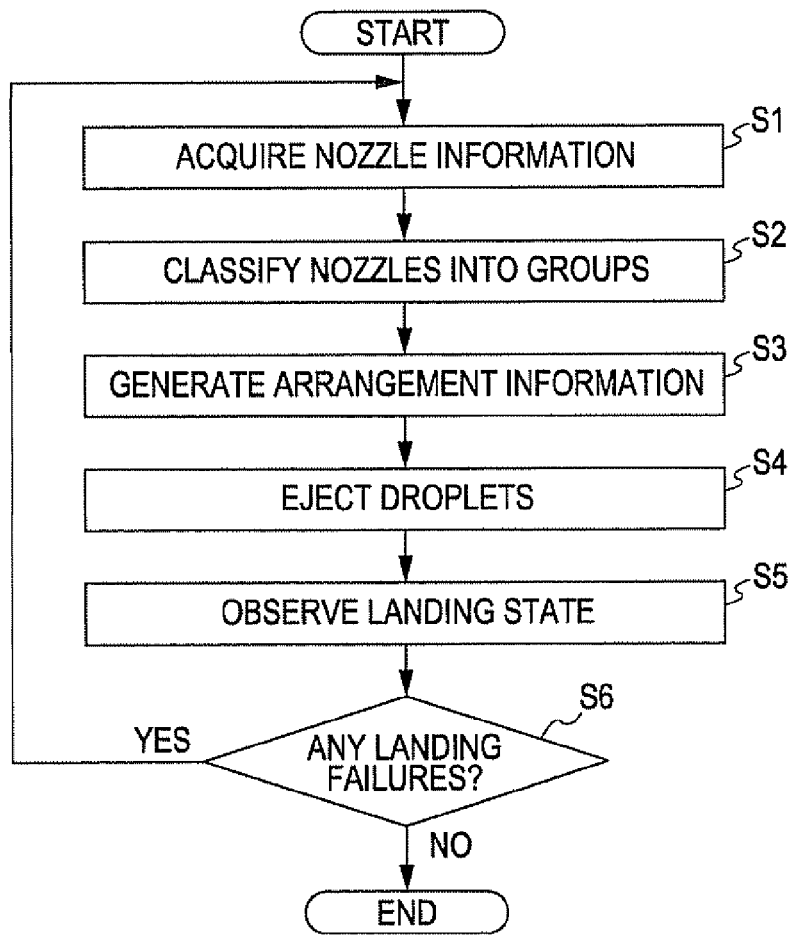
FIG. 10 is a table that summarizes the classification of the nozzles into nozzle groups.
FIG. 11 is a flowchart showing a method for ejecting a liquid material.

FIG. 9 is a graph showing the distribution of droplet landing positions in the sub-scanning direction. Specifically, the horizontal axis indicates the displacement Δx for each nozzle 52, and the vertical axis indicates the number, or the frequency, of nozzles 52 that produce displacements Δx within a predetermined range. As can be seen from FIG. 9, the frequency distribution of the nozzles 52 based on the landing positions is substantially a normal distribution. In the first embodiment, the nozzles 52 are classified into eight X-axis nozzle groups G1 to G8. The distribution range of the displacement Δx for each of the X-axis nozzle groups G1 to G8 is predetermined as 2.5 μm. In other words, the landing position accuracy (distribution range of landing positions) represented by the circle of φ20 μm is divided into eight equal sections. Consequently, the range of each section is 2.5 μm. The range of the displacement Δx for each nozzle group is determined as 2.5 μm for the following reason: In the first embodiment, the width of the bank Ba is the smallest at the X-axis width Bw, which is 5 μm. To control droplets D so as not to land beyond the bank Ba, it is preferable to set the range of the displacement Δx to half the width Bw, which is 2.5 μm. FIG. 10 is a table that summarizes the classification of the nozzles 52 into the X-axis nozzle groups G1 to G8.

Referring to FIG. 10, the nozzles 52 that are numbered beforehand are allocated to the corresponding X-axis nozzle groups G1 to G8. FIG. 10 is based on information (Δx) on landing positions of droplets D in the sub-scanning direction (X-axis direction). In addition to this, the nozzles 52 are also classified into Y-axis nozzle groups on the basis of information (Δy) on landing positions of droplets D in the main scanning direction (Y-axis direction). The information on the X-axis nozzle groups and the information on the Y-axis nozzle groups are used for generating data (correction information) used for correcting positions of droplets D. Such data is stored in the RAM 43 of the liquid ejecting apparatus 10 or the storage unit of the host computer 11, as in the case of nozzle information.

Figure 12A:
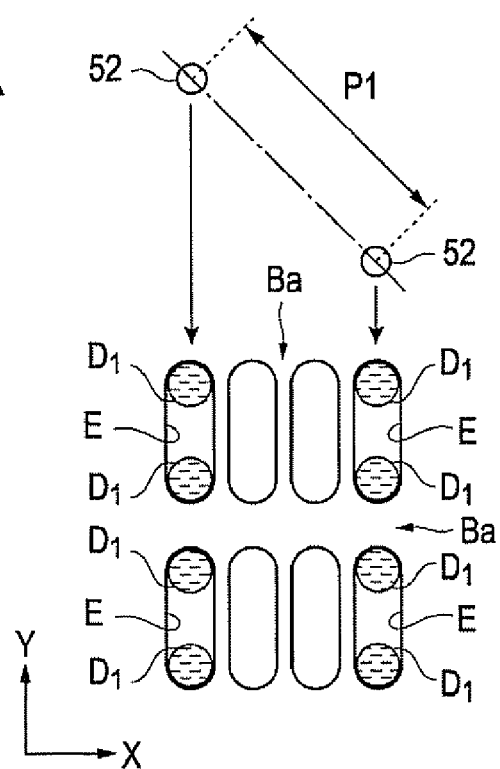
FIG. 12A is a schematic plan view showing a method for ejecting a liquid material according to Example 1.
Figure 12B:
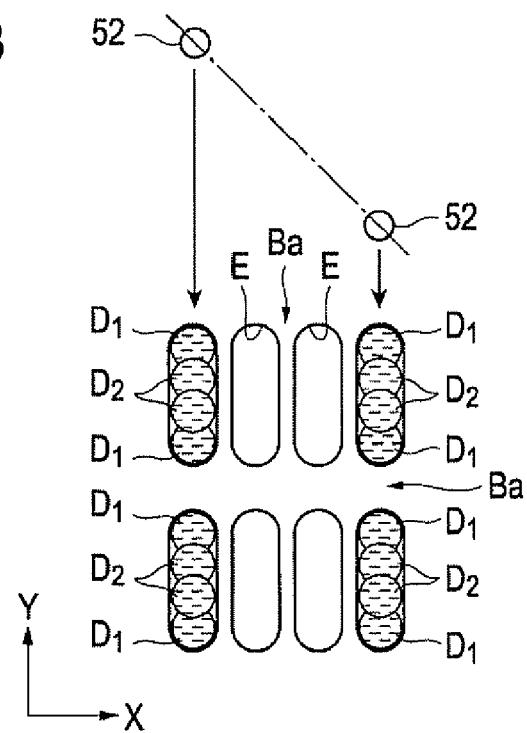
FIG. 12B is another schematic plan view showing the method for ejecting a liquid material according to Example 1.

Next, the method for ejecting a liquid material using the liquid ejecting apparatus 10 will be described more specifically with reference to FIGS. 11 to 13B. FIG. 11 is a flowchart showing the method for ejecting a liquid material. FIGS. 12A and 12B are schematic plan views showing a method for ejecting a liquid material according to Example 1. FIGS. 13A to 14B are schematic plan views showing a method for ejecting a liquid material according to Example 2.

Referring to FIG. 11, the method for ejecting a liquid material according to the first embodiment includes the following steps: A nozzle-information acquiring step (step S1) is for acquiring ejection characteristics of the individual nozzles 52 as nozzle information. A nozzle classifying step (step S2) is for classifying the nozzles 52 into a plurality of nozzle groups (X-axis nozzle groups and Y-axis nozzle groups) that eject droplets D with different landing position accuracies. An arrangement-information generating step (step S3) is for generating arrangement information used for arranging the droplets D of the liquid material of a required volume in each target region E. An ejecting step (step S4) is for ejecting the droplets D toward the target regions E. In this step, the relative positions of the substrate w and the nozzles 52 are corrected for each X-axis nozzle group in accordance with the arrangement information and the information on the X-axis nozzle groups, at least one nozzle 52 is selected from each X-axis nozzle group, and the timings of ejection through the nozzles 52 selected from the respective X-axis nozzle groups are controlled in accordance with the information on the Y-axis nozzle groups. A landing-state observing step (step S5) is for observing the landing state of the droplets D ejected onto the substrate W. The last step (step S6) is for checking whether or not there are any landing failures. Steps S1 and S2 have been described above. Hereafter, starting from step S3, the method for ejecting a liquid material in Example 1 will be described.

EXAMPLE 1

Referring to FIG. 11, in step S3, which is the arrangement-information generating step, arrangement information used for arranging four droplets D in each predetermined target region E as shown in FIGS. 12A and 12B is generated by the host computer 11. Among the target regions E arranged in a matrix with a density of 400 ppi, every two other target regions E in the X-axis direction are to be provided with a liquid material of the same kind. These target regions E are continuously aligned in the Y-axis direction. In this case, the liquid ejecting head 50 is angled in plan view when being positioned to face the substrate W, whereby the nozzle pitch P1 (about 140 μm) and the arrangement pitch (about 63 μm) of the target regions E to be provided with the liquid material of the same kind are matched. The direction in which the liquid ejecting head 50 is angled is arbitrary. Practically, the turnable mechanism 7 of the liquid ejecting apparatus 10 is driven to turn the head unit 9, whereby the head unit 9 is positioned with respect to the substrate W placed on the set table 5 (see FIG. 1).

In the first embodiment, the four droplets D are provided to each predetermined target region E in the following manner: First, two droplets D are provided near the respective Y-axis ends of the target region E, the two droplets D being spaced apart from each other. That is, two droplets D are ejected first. Then, two other droplets D are ejected in such a manner as to fill the space between the first two droplets D. Thus, the liquid material is made to spread evenly within the target region E. Therefore, the arrangement information contains at least the following pieces of information: information on X-axis positions, with respect to the substrate W, of the nozzles 52 used for ejection of droplets D of the same kind, and information on the timings of ejection in the Y-axis direction in the case where the four droplets D are ejected separately in two or more main scanning operations. Specifically, information on the arrangement of the four droplets D in a desired target region E is generated as bitmap data. Additionally, the arrangement information may be generated in such a manner that the main scanning for ejecting droplets D is performed independently for each of the forward movements and the backward movements in the relative movements of the liquid ejecting head 50 and the substrate W. In that case, ejection is performed with respective timings suitable for the forward and backward movements. Then, the operation proceeds to step S4.

Referring back to FIG. 11, step S4 is the ejecting step. In step S4, referring now to FIG. 12A, first main scanning is performed in which two droplets $D_1$ are ejected with a space therebetween toward each of the target regions E to be provided with a liquid material of the same kind. In the main scanning, droplets $D_1$ are ejected through some nozzles 52, which are selected from the respective X-axis nozzle groups, in accordance with the correction information acquired in step S2. Practically, the first main scanning is a combination of the sub-scanning, in which the nozzles 52 are moved in the X-axis direction in accordance with the Δx correction values set for the respective X-axis nozzle groups, and the main scanning, in which droplets $D_1$ are ejected for one X-axis nozzle group at a time through the selected nozzles 52 with timings according to the Δy correction values set for the respective Y-axis nozzle groups. The first main scanning is performed at least a number of times corresponding to the number of X-axis nozzle groups to which the selected nozzles 52 belong. That is, ejection operation is performed for one X-axis nozzle group at a time. Next, referring to FIG. 12B, second main scanning is performed in which two droplets $D_2$ are ejected in such a manner as to fill the space between the droplets $D_1$ that have ejected first. Practically, the second main scanning is also a combination of the sub-scanning, in which the nozzles 52 are moved in the X-axis direction in accordance with the Δx correction values set for the respective X-axis nozzle groups, and the main scanning, in which droplets $D_2$ are ejected for one X-axis nozzle group at a time through the selected nozzles 52 with timings according to the Δy correction values set for the respective Y-axis nozzle groups. The second main scanning is performed at least a number of times corresponding to the number of X-axis nozzle groups to which the selected nozzles 52 belong. Then, the operation proceeds to step S5.

Referring back to FIG. 11, step S5 is the landing-state observing step. In step S5, the substrate W onto which the liquid material has been ejected is observed by taking an image thereof using the camera 15 mounted on the liquid ejecting apparatus 10. For example, if the volume of the liquid material that has been provided to a target region E does not reach a required volume, the liquid material may not spread over the entirety of the target region E. By identifying the position of such a target region E, the nozzle 52 causing such a failure can be found. In the case where liquid materials of different kinds are ejected, if the landing position of a droplet D is displaced, a landing failure in which the different liquid materials are mixed together may occur. If the different liquid materials have different colors, such a landing failure can be recognized as a color mixture. By identifying the position of the color mixture, the nozzle 52 causing the landing failure can be found. Then, the operation proceeds to step S6.

Referring to FIG. 11, in step S6 for checking whether or not there are any landing failures, the presence of any landing failures as described in step S5 is checked. If a landing failure is found, the operation returns to step S1 and nozzle information is acquired again. If the nozzle 52 causing the landing failure has been identified, the correction information can be modified appropriately by reviewing the reacquired nozzle information according to need. Before reacquiring the nozzle information, it is desirable to perform maintenance operations such as removal of foreign substances and the residual liquid material adhering on the nozzle surfaces of the liquid ejecting head 50 and removal of the dried liquid material in the nozzles 52. If no landing failure is found, the operation for ejecting the liquid material is completed.

According to the method for ejecting a liquid material in Example 1, in the ejection operation performed for each of the X-axis nozzle groups, the X-axis positions of the selected nozzles 52 relative to the substrate W are the results of the correction performed in accordance with the landing position accuracy. Further, the timings of ejecting droplets D (droplets $D_1$ and $D_2$) during the movement in the Y-axis direction are the results of correction performed for each of the Y-axis nozzle groups to which the selected nozzles 52 belong. Therefore, even in the case where a plurality of target regions E are arranged with a definition as high as 400 ppi, a required volume of a liquid material can be provided in a form of droplets D with a high accuracy. In other words, even if the landing position accuracy of the liquid ejecting head 50 does not reach the required level, a required volume of a liquid material can be assuredly provided to each of the target regions E arranged with a high definition.

EXAMPLE 2

The relative arrangement between the nozzles 52 and the target regions E in the ejecting step is not limited to that described above. For example, referring to FIGS. 13A to 14B, a method for ejecting a liquid material according to Example 2 employs an arrangement in which the target regions E are oriented so as to extend in the X-axis direction, and a liquid material of the same kind is ejected in a form of droplets D toward some target regions E that are continuously aligned in the X-axis direction. Also in Example 2, four droplets D are provided for each of these target regions E.

Figure 13A:
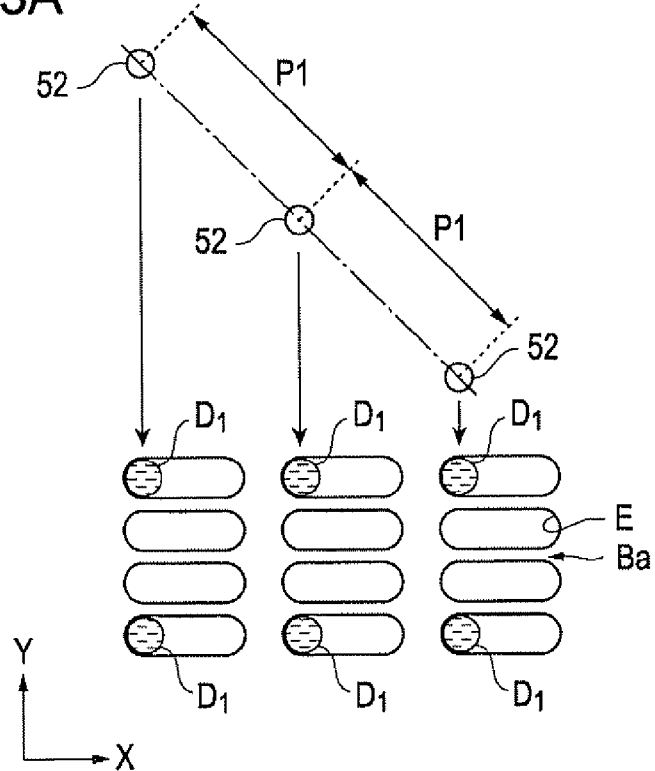
FIG. 13A is a schematic plan view showing a method for ejecting a liquid material according to Example 2.

First, referring to FIG. 13A, the liquid ejecting head 50 is turned with respect to the substrate W in such a manner that droplets $D_1$ can each land near one of the X-axis ends of the target region E. The nozzle pitch P1 and the X-axis arrangement pitch (about 63 μm) of the target regions E are matched. Then, in accordance with arrangement information on the droplets $D_1$ and correction information on the droplets $D_1$ in the X- and Y-axis directions, sub-scanning for moving the nozzles 52 and main scanning for ejecting the droplets $D_1$ through the selected nozzles 52 are performed. The main scanning is performed for one X-axis nozzle group at a time. Practically, the sub-scanning and the main scanning are repeated at least a number of times corresponding to the number of X-axis nozzle groups to which the selected nozzles 52 belong.

Figure 13B:
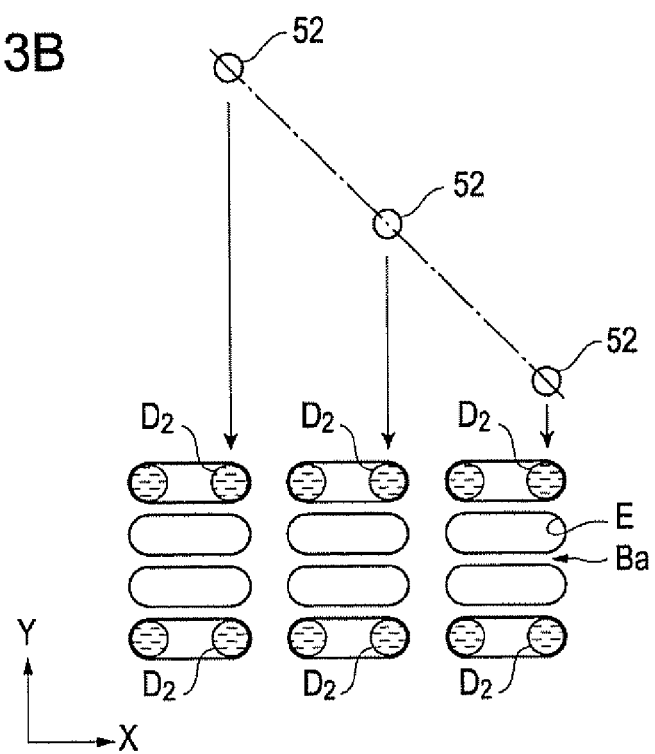
FIG. 13B is another schematic plan view showing the method for ejecting a liquid material according to Example 2.

Next, referring to FIG. 13B, sub-scanning for moving the nozzles 52 is performed in such a manner that droplets $D_2$ each can land near the other X-axis end of the target region E. Then, as in the case shown in FIG. 13A, the sub-scanning and the main scanning are repeated at least a number of times corresponding to the number of X-axis nozzle groups to which the selected nozzles 52 belong, whereby the droplets $D_2$ are ejected toward positions spaced apart from the droplets $D_1$.

Figure 14A:
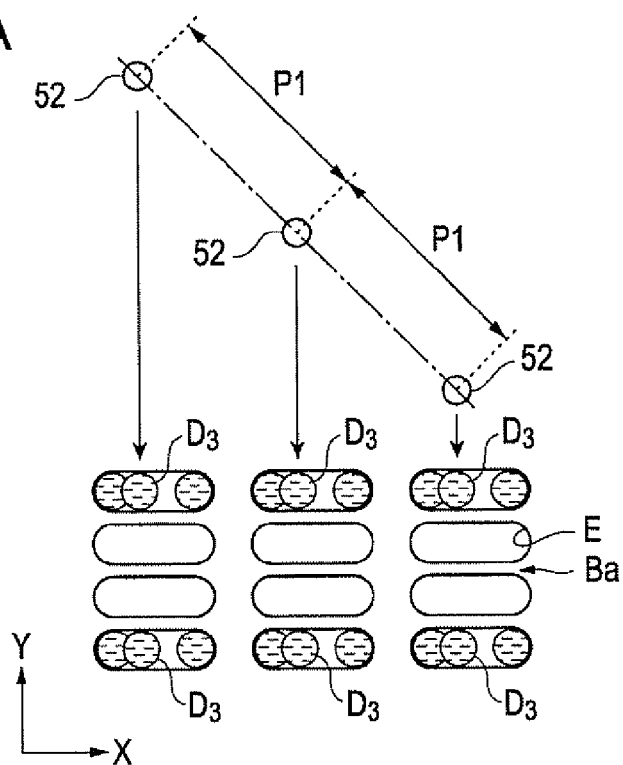
FIG. 14A is another schematic plan view showing the method for ejecting a liquid material according to Example 2.
Figure 14B:
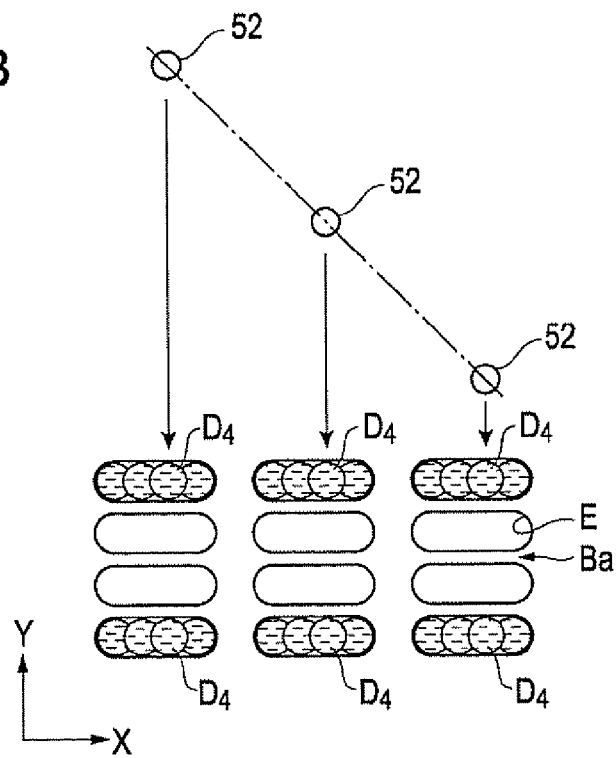
FIG. 14B is another schematic plan view showing the method for ejecting a liquid material according to Example 2.

Likewise, referring to FIGS. 14A and 14B, the droplets $D_3$ and $D_4$ are ejected in such a manner as to fill the space between the droplets $D_1$ and $D_2$.

According to the method for ejecting a liquid material in Example 2, the sub-scanning and the main scanning need to be performed more times than in Example 1. On the other hand, the correction for the timings of ejecting droplets D during the main scanning relates to the traveling speed of the set table 5 of the liquid ejecting apparatus 10 and the frequency (ejection cycle) of the driving pulse supplied to the vibrators 59. That is, the correction of ejection timings depends on the resolution in performing ejection. This means that ejection timings can be corrected with a relatively high accuracy. In Example 2, because the target regions E to be provided with liquid materials of different kinds are aligned in the main-scanning direction (Y-axis direction), droplets D can be arranged with a higher accuracy. In other words, the method for ejecting a liquid material according to Example 2 employs an arrangement of the target regions E in which the narrower arrangement pitch matches the direction in which the landing positions of droplets D can be controlled with a higher accuracy.

Advantages brought by the first embodiment are summarized below.

(1) In the method for ejecting a liquid material according to the first embodiment, the nozzles 52 of each liquid ejecting head 50 are classified into eight X-axis nozzle groups G1 to G8 having different accuracies in the X-axis landing position of droplets D. Then, four droplets D in total are ejected toward each of the target regions E to be provided with a liquid material of the same kind by simultaneously performing sub-scanning, in which the landing positions of droplets D ejected through selected ones of the nozzles 52 are shifted in the X-axis direction for each X-axis nozzle group in accordance with correction values, and main scanning, in which droplets D are ejected through the selected nozzles 52 with timings in accordance with correction values. The classification of the X-axis nozzle groups G1 to G8 is made by dividing a frequency distribution of the landing positions of the droplets D. The range of each of the sections is determined as a value (2.5 μm) that is half the width Bw of the bank Ba. Therefore, the droplets D ejected through the selected nozzles 52 land within the respective target regions E within this range of accuracy. Thus, even if a droplet D to produce a post-landing diameter that is almost equal to the width Pw of the target region E is ejected, occurrence of landing failure in which a droplet D lands beyond the bank Ba can be suppressed. Accordingly, a required volume of a liquid material can be ejected with a high accuracy in a form of droplets D toward the target regions E that are arranged with a high definition (400 ppi). Moreover, mixture of liquid materials of different kinds within a single target region E can be suppressed. In other words, even with a liquid ejecting head 50 that does not reach the required level of landing position accuracy of droplets D, substantially high landing position accuracy can be realized.

(2) In the method for ejecting a liquid material according to the first embodiment, information on the landing position accuracy of the nozzles 52 is provided as a frequency distribution based on nozzle information acquired in the nozzle-information acquiring step. In the nozzle-information acquiring step, the same as in the actual ejection of droplets D toward the substrate W, the liquid ejecting head 50 and an ejection target (the recording paper 18 or the substrate W) used for observation of the landing state are moved relative to each other, whereby droplets D are ejected through the nozzles 52 toward a virtual straight line extending in the sub-scanning direction. Accordingly, accurate landing position information based on the actual circumstances of ejection can be acquired for each nozzle 52.

Second Embodiment

Figure 15:
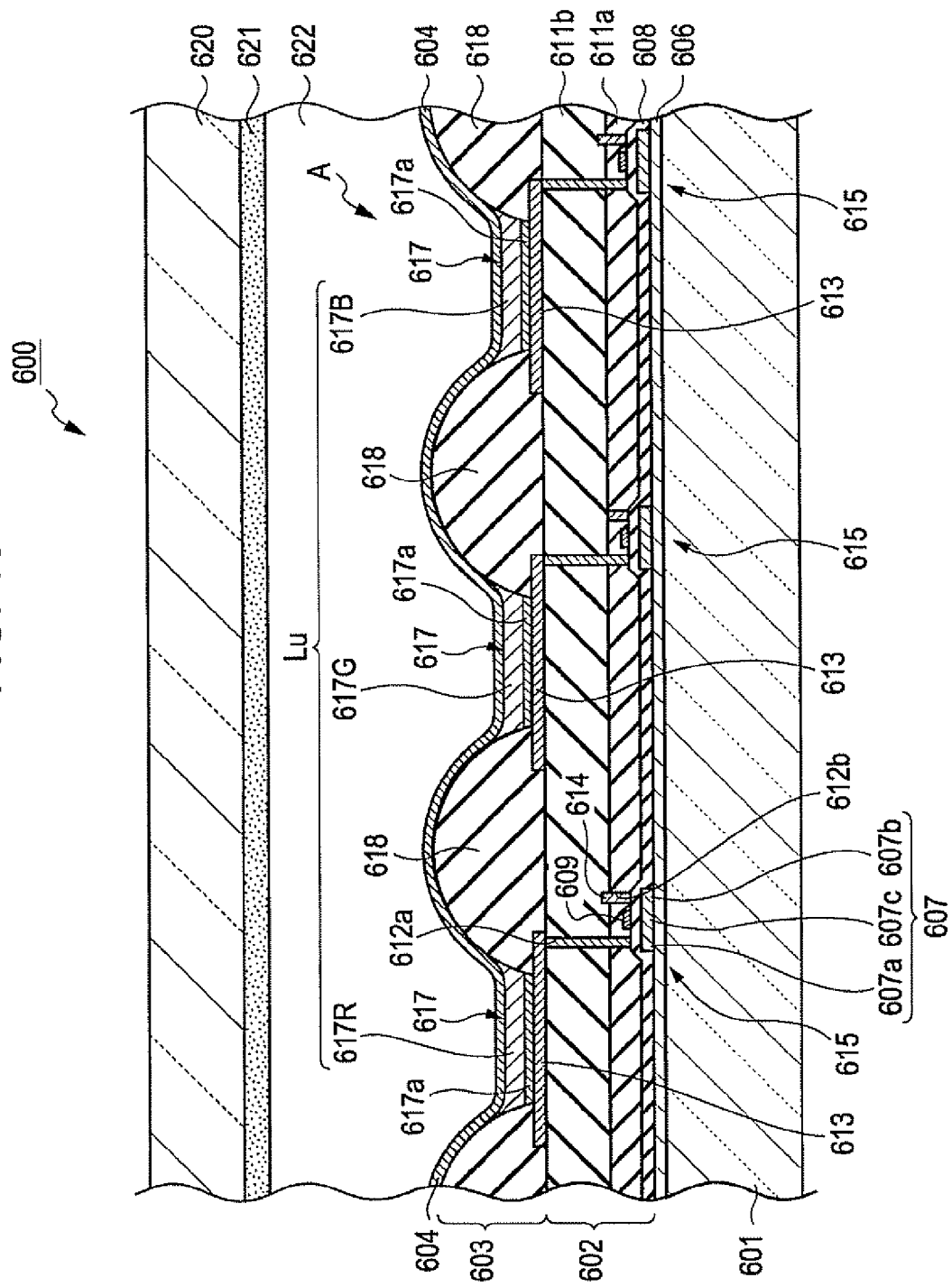
FIG. 15 is a schematic sectional view showing the configuration of an organic EL apparatus.

Next, a method for manufacturing an organic electroluminescence (EL) device using the method for ejecting a liquid material according to the first embodiment will be described with reference to FIGS. 15 and 16A to 16F. FIG. 15 is a schematic sectional view showing the configuration of an organic EL apparatus. FIGS. 16A to 16F are schematic sectional views for describing a method for manufacturing an organic EL device.

Organic EL Apparatus

Referring to FIG. 15, an organic EL apparatus 600 according to a second embodiment includes a device substrate 601 provided with a light-emitting-element section 603 thereon functioning as an organic EL device, and a sealing substrate 620 sealed to the device substrate 601 with a space 622 therebetween. The device substrate 601 is also provided with a circuit element section 602 thereon. The light-emitting-element section 603 overlies the circuit element section 602, thereby being driven by the circuit element section 602. In the light-emitting-element section 603, three light-emitting layers 617R, 617G, and 617B serving as organic EL light-emitting layers are provided in corresponding light-emitting-layer regions A, thereby forming a stripe pattern. The device substrate 601 forms a structure in which picture elements each being constituted by the three light-emitting-layer regions A in which the three light-emitting layers 617R, 617G, and 617B are correspondingly provided are arranged in a matrix over the circuit element section 602 on the device substrate 601. In the second embodiment, the light-emitting-layer regions A are arranged with a density of 400 ppi on the device substrate 601. The organic EL apparatus 600 outputs light emitted from the light-emitting-element section 603 through the device substrate 601.

The sealing substrate 620 is made of glass or metal, and is bonded to the device substrate 601 with a sealing resin provided therebetween. The sealing substrate 620 has on its inner surface a getter 621. The getter 621 absorbs water or oxygen entering the space 622 sealed between the device substrate 601 and the sealing substrate 620, thereby preventing the degradation of the light-emitting-element section 603 due to such water or oxygen. However, the getter 621 is not necessarily provided.

The device substrate 601, having the light-emitting-layer regions A thereon with the circuit element section 602 interposed therebetween, also has a bank 618 thereon provided in a pattern that defines the light-emitting-layer regions A, electrodes 613 provided in correspondence with the light-emitting-layer regions A, and hole injection/transportation layers 617a provided on the respective electrodes 613. The light-emitting-element section 603 includes the light-emitting layers 617R, 617G, and 617B, which are formed by providing three kinds of liquid materials containing materials functioning as light-emitting layers (hereinafter referred to as light-emitting-layer material) in the corresponding light-emitting-layer regions A. The bank 618, which is composed of an insulating material, covers the peripheral portions of the electrodes 613 so as to prevent the short circuit between the electrodes 613 and the corresponding light-emitting layers 617R, 617G, and 617B provided on the hole injection/transportation layers 617a.

The device substrate 601 is a transparent substrate made of glass, for example. A surface of the device substrate 601 is covered with an underlying protective film 606, which is a silicon oxide film. On the underlying protective film 606, island semiconductor films 607 composed of polycrystalline silicon are provided. The semiconductor films 607 each include a source region 607a and a drain region 607b both formed by implanting high-concentration P ions. A portion in which high-concentration P ions are not implanted serves as a channel region 607c. The underlying protective film 606 and the semiconductor films 607 are covered with a transparent gate insulating film 608. On the gate insulating film 608, gate electrodes 609 composed of Al, Mo, Ta, Ti, or W, for example, are disposed. The gate electrodes 609 and the gate insulating film 608 are covered with transparent first and second interlayer insulating films 611a and 611b. The gate electrodes 609 are disposed at positions corresponding to the channel regions 607c of the respective semiconductor films 607. The first and second interlayer insulating films 611a and 611b have contact holes 612a and 612b reaching the source regions 607a and the drain regions 607b, respectively, of the semiconductor films 607. The electrodes 613, which are transparent and composed of indium tin oxide (ITO) or the like, are formed in a predetermined pattern on the second interlayer insulating film 611b. The contact holes 612a reach the respective electrodes 613. The contact holes 612b reach respective power lines 614. In such a manner, the circuit element section 602 includes driver thin-film transistors 615 that are connected to the respective electrodes 613. The circuit element section 602 also includes hold capacitors and switcher thin-film transistors, which are both omitted in FIG. 15.

The light-emitting-element section 603 includes the electrodes 613 serving as positive electrodes; the hole injection/transportation layers 617a and the light-emitting layers 617R, 617G, and 617B (generally referred to as light-emitting layers Lu) provided in that order on the electrodes 613; and a negative electrode 604 covering the bank 618 and the light-emitting layers Lu. Each set of a hole injection/transportation layer 617a and a corresponding one of the light-emitting layers Lu constitute a functional layer 617 that emits light by excitation therebetween. It the negative electrode 604, the sealing substrate 620, and the getter 621 are made of transparent materials, the emitted light can be output through the sealing substrate 620.

The organic EL apparatus 600 includes scanning lines and signal lines (not shown) connected to the gate electrodes 609 and the source regions 607a, respectively. When a switcher thin-film transistor (not shown) is turned on in response to a scanning signal transmitted via the corresponding scanning line, the current potential of the signal line is held in the corresponding hold capacitor. In accordance with the state of the hold capacitor, the corresponding driver thin-film transistor 615 is turned on or off. An electric current is supplied from the power lines 614 through the channel regions 607c of the driver thin-film transistors 615 to the electrodes 613, and flows through the hole injection/transportation layers 617a and the light-emitting layers Lu, to the negative electrode 604. The light-emitting layers Lu emit light in accordance with the amount of the current that flows therethrough. The organic EL apparatus 600 can display desired characters or images with the above-described mechanism of the light-emitting-element section 603. Since the light-emitting layers Lu of the organic EL apparatus 600 are formed by the method for ejecting a liquid material according to the first embodiment, required volumes of liquid materials are provided in the respective light-emitting-layer regions A. Thus, the organic EL apparatus 600 has a high display quality with few display failures, such as unevenness in emission or brightness, while realizing high-definition display.

Method for Manufacturing Organic EL Device

Next, a method for manufacturing an organic EL device, which corresponds to the light-emitting-element section 603 according to the second embodiment, will be described with reference to FIGS. 16A to 16F. In FIGS. 16A to 16F, the circuit element section 602 provided on the device substrate 601 is omitted.

A method for manufacturing the light-emitting-element section 603 according to the second embodiment includes the following: a positive-electrode forming step for forming the electrodes 613 on the device substrate 601 at positions corresponding to the light-emitting-layer regions A, a bank forming step for forming the bank 618 in such a manner that portions thereof overlie the electrodes 613, a first surface-finishing step for finishing the surface of the light-emitting-layer regions A defined by the bank 618, a hole-injection/transportation-layer forming step for forming the hole injection/transportation layers 617a by ejecting a liquid material containing a material functioning as a hole injection/transportation layer (hereinafter referred to as a hole-injection/transportation-layer material) toward the surface-finished light-emitting-layer regions A, a first curing step for drying and curing the ejected liquid material to obtain the hole injection/transportation layers 617a, a second surface-finishing step for finishing the surface of the light-emitting-layer regions A now having the hole injection/transportation layers 617a thereon, a liquid-material ejecting step for ejecting three kinds of liquid materials containing light-emitting-layer materials toward the respective surface-finished light-emitting-layer regions A, a second curing step for drying and curing the ejected liquid materials to obtain the light-emitting layers Lu, and a negative-electrode forming step for forming the negative electrode 604 in such a manner as to cover the bank 618 and the light-emitting layers Lu. Each of the liquid materials is provided to the corresponding light-emitting-layer regions A by the method for ejecting a liquid material according to the first embodiment. Therefore, in the second embodiment, the arrangement of the liquid ejecting heads 50 provided on the head unit 9 shown in FIG. 3 is applied.

Figure 16A:
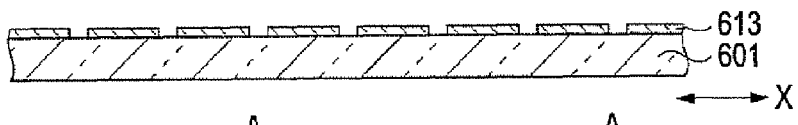
FIG. 16A is a schematic sectional view for describing a method for manufacturing an organic EL device.

Referring to FIG. 16A, which shows the positive-electrode forming step, the electrodes 613 are formed on the device substrate 601 at positions corresponding to the light-emitting-layer regions A. Specifically, for example, a material functioning as a transparent electrode, such as ITO, is provided on the surface of the device substrate 601 by sputtering or deposition performed in vacuum, whereby a transparent electrode film is obtained. Then, unnecessary portions of the film are etched off by photolithography, whereby the electrodes 613 are obtained. The operation proceeds to the bank forming step.

Figure 16B:
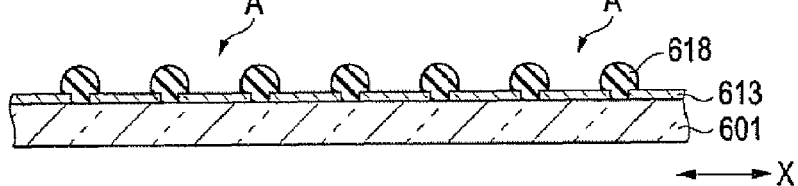
FIG. 16B is another schematic sectional view for describing the method for manufacturing an organic EL device.

Referring to FIG. 16B, which shows the bank forming step, the bank 618 is formed in such a manner as to cover the peripheral portions of the individual electrodes 613 provided on the device substrate 601. Desirably, the material of the bank 618 is resistive to the solvents for below-described three kinds of liquid materials 100R, 100G, and 100B containing different light-emitting-layer materials, and is capable of becoming liquid-repellent by being subjected to plasma processing using a fluorine-based gas. Preferable examples of such a material include insulative organic materials such as acrylic resin, epoxy resin, and photosensitive polyimide. The bank 618 is formed by, for example, applying the aforementioned photosensitive organic material to the surface of the device substrate 601 having the electrodes 613 thereon by roll coating or spin coating, drying the material to obtain a photosensitive resin layer having a thickness of about 2 to 3 μm, and then performing exposure and development thereon with a mask, which has openings of sizes corresponding to the respective light-emitting-layer regions A, placed at a predetermined position to face the device substrate 601. The operation proceeds to the first surface-finishing step.

In the first surface-finishing step for finishing the surface of the light-emitting-layer regions A, the surface of the device substrate 601 having the bank 618 thereon is subjected to a plasma processing using an $O_2$ gas. This is a lyophilic processing in which the surfaces (including the sidewalls) of the electrodes 613 and the bank 618 are activated, Next, the device substrate 601 is subjected to another plasma processing using a fluorine-based gas such as $CF_4$. In this processing, the fluorine-based gas only reacts to the surface of the bank 618, which is composed of organic photosensitive resin, thereby giving liquid repellency only to the surface of the bank 618. The operation proceeds to the hole-injection/transportation-layer forming step.

Figure 16C:
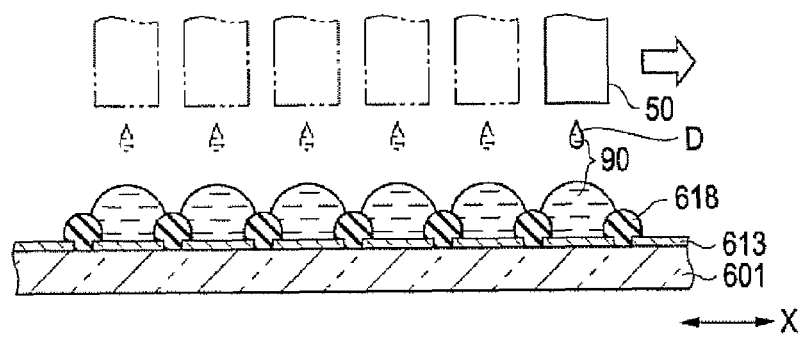
FIG. 16C is another schematic sectional view for describing the method for manufacturing an organic EL device.

Referring to FIG. 16C, which shows the hole-injection/transportation-layer forming step, a liquid material 90 containing a hole-injection/transportation-layer material is provided to the light-emitting-layer regions A. Specifically, the hole-injection/transportation-layer forming step is performed with the liquid ejecting apparatus 10 having the head unit 9, shown in FIG. 3, by the method for ejecting a liquid material according to the first embodiment (Example 1). The liquid material 90 ejected in a form of droplets D from the liquid ejecting heads 50 lands on and spreads over the electrodes 613 provided on the device substrate 601. The volumes of the droplets D of the liquid material 90 to be ejected are determined in accordance with the areas of the light-emitting-layer regions A. The operation proceeds to the first curing step.

In the first curing step, the solvent contained in the liquid material 90 is removed by drying in which the device substrate 601 is subjected to a heat treatment such as lamp annealing. Thus, the hole injection/transportation layers 617a are obtained on the electrodes 613 in regions defined by the bank 618. In the second embodiment, polyethylenedioxythiophene (PEDOT) is used as the hole-injection/transportation-layer material. In the second embodiment, all of the light-emitting-layer regions A are provided with the hole injection/transportation layers 617a composed of the same material. However, the material of the hole injection/transportation layers 617a may be changed with the light-emitting-layer regions A in correspondence with the light-emitting layers Lu to be formed later. The operation proceeds to the second surface-finishing step.

In the second surface-finishing step, the surfaces of the hole injection/transportation layers 617a, if formed of the aforementioned material, are repellent to the three kinds of liquid materials 100R, 100G, and 100B. Therefore, at least the surfaces of the light-emitting-layer regions A need to be subjected to lyophilic processing again. Specifically, solvents used in obtaining the liquid materials 100R, 100G, and 100B are applied to and dried on the surface of the light-emitting-layer regions A. The solvents are applied by spraying, spin coating, or the like. The operation proceeds to the liquid-material ejecting step.

Figure 16D:
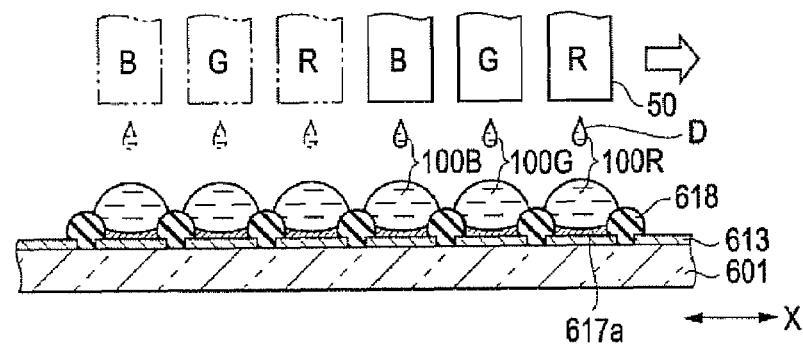
FIG. 16D is another schematic sectional view for describing the method for manufacturing an organic EL device.

Referring to FIG. 16D, which shows the liquid-material ejecting step, the liquid materials 100R, 100G, and 100B of three kinds containing light-emitting-layer materials are ejected from the liquid ejecting heads 50 of the liquid ejecting apparatus 10 toward the corresponding light-emitting-layer regions A. The liquid material 100R contains a material functioning as the light-emitting layer 617R (red), the liquid material 100G contains a material functioning as the light-emitting layer 617G (green), and the liquid material 100B contains a material functioning as the light-emitting layer 617B (blue). The liquid materials 100R, 100G, and 100B that have landed on the light-emitting-layer regions A spread thereover with a round cross-section. The liquid materials 100R, 100G, and 100B are provided by the method for ejecting a liquid material according to the first embodiment (Example 1). The operation proceeds to the second curing step.

Figure 16E:
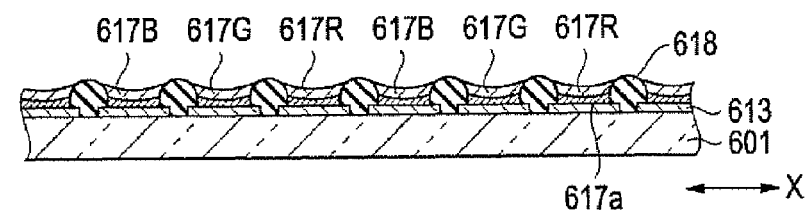
FIG. 16E is another schematic sectional view for describing the method for manufacturing an organic EL device.

Referring to FIG. 16E, which shows the second curing step, the solvents contained in the ejected liquid materials 100R, 100G, and 100B are removed by drying, thereby obtaining the light-emitting layers 617R, 617G, and 617B over the hole injection/transportation layers 617a in the corresponding light-emitting-layer regions A. Preferably, the device substrate 601 having the liquid materials 100R, 100G, and 100B ejected thereonto is dried under a reduced pressure, in which the evaporation rates of the solvents can be made substantially constant. The operation proceeds to the negative-electrode forming step.

Figure 16F:
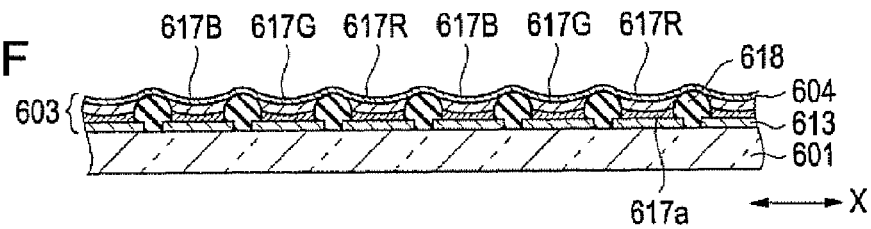
FIG. 16F is another schematic sectional view for describing the method for manufacturing an organic EL device.

Referring to FIG. 16F, which shows the negative-electrode forming step, the negative electrode 604 is formed in such a manner as to cover the light-emitting layers 617R, 617G, and 617B, and the bank 618 provided on the device substrate 601. Preferably, the negative electrode 604 is composed as a combination of a metal, such as Ca, Ba, or Al, and a fluoride, such as LiF. In particular, it is preferable that a portion near the light-emitting layers 617R, 617G, and 617B form a film composed of Ca, Ba, or LiF having a small work function, and that a portion positioned away from the light-emitting layers 617R, 617G, and 617B form a film composed of Al or the like having a large work function. Additionally, a protective layer composed of $SiO_2$, SiN, or the like may be provided over the negative electrode 604. Such a protective layer prevents the oxidation of the negative electrode 604. The negative electrode 604 can be formed by, for example, deposition, sputtering, or chemical vapor deposition (CVD). From the viewpoint of preventing heat damage to the light-emitting layers 617R, 617G, and 617B, deposition is preferred.

The device substrate 601 obtained through the steps described above has the light-emitting layers 617R, 617G, and 617B having substantially constant thicknesses, as a result of a process in which required volumes of the liquid materials 100R, 100G, and 100B are provided in a form of droplets D in the corresponding light-emitting-layer regions A and cured by being dried. Further, since the droplets D are ejected with a high landing position accuracy toward the light-emitting-layer regions A arranged with a high definition, color mixing between the light-emitting layers Lu due to mixing of liquid materials of different kinds can be suppressed.

Advantages brought by the second embodiment are summarized below.

(1) The method for manufacturing the light-emitting-element section 603 according to the second embodiment includes the liquid-material ejecting step, in which the liquid materials 100R, 100G, and 100B are ejected in a form of droplets D toward the light-emitting-layer regions A defined on the device substrate 601, with a high landing position accuracy by the method for ejecting a liquid material according to the first embodiment (Example 1). Accordingly, the volumes of the liquid materials 100R, 100G, and 100B to be provided can be set as required. Thus, the light-emitting layers 617R, 617G, and 617B having substantially constant post-curing thicknesses can be obtained. Further, the light-emitting-element section 603 infrequently causing color mixing between the light-emitting layers Lu can be manufactured.

(2) When the organic EL apparatus 600 is manufactured by the method for manufacturing the light-emitting-element section 603 according to the second embodiment, the thicknesses of the light-emitting layers 617R, 617G, and 617B can be made substantially constant. This makes the resistances of the light-emitting layers 617R, 617G, and 617B substantially constant. Accordingly, the light-emitting-element section 603 driven with a driving voltage applied by the circuit element section 602 emits light in which unevenness in emission, brightness, and the like due to unevenness in resistances of the respective groups of the light-emitting layers 617R, 617G, and 617B is small. That is, the organic EL apparatus 600 can be manufactured with small unevenness in emission and brightness and a high-definition display quality producing a fine view.

The embodiments described above can be modified in various ways. Exemplary modifications will be given below.

Modification 1

In the method for ejecting a liquid material according to the first embodiment, the target regions E on the substrate W are not necessarily arranged with a density of 400 ppi. In accordance with the density of the target regions E, the range of accuracy to be determined in classifying the nozzles can be set in each of the sub-scanning and main scanning directions. If it is desired to make droplets D land with a higher accuracy regardless of the number of times required to perform the sub-scanning and the main scanning, it is only necessary to set the range of accuracy to a value smaller than that in the first embodiment.

Modification 2

In the method for ejecting a liquid material according to the first embodiment, the classification of the nozzles 52 into nozzle groups having different landing position accuracies is not necessarily made for both the sub-scanning and main scanning directions. For example, the classification may be made only for the sub-scanning direction, in which control of the landing positions of droplets D is relatively difficult. In that case, it is desirable that the nozzles 52 and the substrate W be positioned relatively to each other in such a manner that the target regions B to be provided with a liquid material of the same kind are aligned continuously in the main scanning direction as in Example 1. Since the target regions E to be provided with a liquid material of the same kind are aligned continuously in the main scanning direction, slight variations in the landing position of droplets D are less influential. Particularly, in the 400-ppi arrangement of the target regions E shown in FIG. 6A, the main-scanning-direction width BL of the bank Ba is larger than the sub-scanning-direction width Bw. This reduces the probability of a droplet D landing beyond the bank Ba.

Modification 3

In the method for ejecting a liquid material according to the first embodiment, the number of X-axis nozzle groups is not necessarily eight denoted as G1 to G8. It is only necessary to change the range of accuracy to be determined in classifying the nozzles 52 in accordance with the distribution of the landing positions of droplets D. Further, the range of accuracy is not necessarily the same for all of the X-axis nozzle groups, and may vary with the required landing position accuracy, the landing position distribution, and the target region arrangement. For example, if landing positions are expressed in a normal distribution, the standard deviation $\sigma$ may be used as a reference. About 68% of all nozzles 52 fall within a range expressed by $\pm 1\sigma$. When the number of nozzle groups is increased, landing position accuracy can be increased, practically. However, the number of times required to perform main scanning also increases. Taking the required landing position accuracy into consideration while aiming to realize highly efficient ejection operation, this can be avoided by including in one of the X-axis nozzle groups as many nozzles 52 as possible that are frequently used. Such a way of setting the range of accuracy can also be applied to the case of Y-axis nozzle groups.

Modification 4

In the method for ejecting a liquid material according to the first embodiment, the element that defines the target regions E on the substrate W are not limited to the bank Ba. As an alternative, regions other than the target regions E may be processed to be liquid-repellent. The surface of the substrate W can be made liquid-repellent by, for example, forming a self-assembled film having liquid repellency from an organic compound such as fluoroalkylsilane.

Modification 5

The method for ejecting a liquid material according to the first embodiment is not limited to that in which liquid materials of different kinds are ejected from the respective liquid ejecting heads 50, and may be that in which a liquid material of the same kind is ejected from all of the liquid ejecting heads 50. For example, if the liquid ejecting heads 50 are aligned along the sub-scanning direction on the head unit 9, the target regions E arranged in a wide area can be provided with a liquid material of the same kind with a high accuracy.

Modification 6

A device manufacturing method to which the method for ejecting a liquid material according to the first embodiment can be applied is not limited to the method for manufacturing an organic EL device according to the second embodiment. The method according to the first embodiment may also be applied to a method for manufacturing a color filter, for example. Such a method includes an ejecting step for ejecting liquid materials containing three different colorants, which have been supplied to the liquid ejecting heads 50, through the nozzles 52 in a form of droplets D toward the target regions E shown in FIGS. 6A and 6B, and a curing step for curing the ejected liquid materials to obtain colored layers of three different colors. According to this method, a high-definition color filter, in which the target regions E serve as colored regions, having colored layers of three different colors can be manufactured. The number of colors of the liquid materials is not limited to three, and may be more including at least red (R), green (G), and blue (B). In that case, it is only necessary to accordingly increase the number of liquid ejecting heads 50 to be mounted on the head unit 9. If a lens material is included in the liquid material, the method according to the first embodiment can also be applied to a method for manufacturing optical lenses in which optical lenses are formed on the substrate W in a high-definition arrangement.

The entire disclosure of Japanese Patent Application No. 2007-163512, filed Jun. 21, 2007 is expressly incorporated by reference herein.

What is claimed is:

1. A method for ejecting a liquid material comprising:
classifying a plurality of nozzles of a head into a plurality of nozzle groups having different landing position accuracies for droplets; and
performing ejection including:
main scanning for ejecting droplets of a liquid material through nozzles selected from the plurality of nozzles toward target regions defined by a bank provided on a target substrate in a pattern forming a matrix, while generating relative movement in a main-scanning direction between the head and the target substrate, and,
sub-scanning for generating relative movement between the head and the target substrate in a sub-scanning direction orthogonal to the main-scanning direction, wherein,
the main scanning and the sub-scanning are performed separately for each of the plurality of nozzle groups, during the sub-scanning, relative movement between the head and the target substrate in the sub-scanning direction is generated in accordance with correction information for the corresponding nozzle group for correcting landing positions of the droplet, and during the main scanning, a droplet is ejected through at least one nozzle selected from the corresponding nozzle group, the plurality of nozzles are classified by dividing a distribution of the landing positions of droplets ejected through the plurality of nozzles into predetermined ranges so as to determine that nozzles corresponding to landing positions falling within a single predetermined range belong to a single nozzle group, and the predetermined ranges are each set to be smaller than or equivalent to half the size of the smallest width of the bank, such that the droplets to be ejected toward the target regions are kept from landing beyond the bank and flowing into an adjacent target region.

2. The method for ejecting a liquid material according to claim 1, wherein the plurality of nozzles are classified into the nozzle groups independently for each of the sub-scanning direction and the main-scanning direction.

3. The method for ejecting a liquid material according to claim 2, wherein the ejection is performed for each of the nozzle groups for the main-scanning direction in such a manner that the droplets are ejected with timings corrected in accordance with the correction information.

4. The method for ejecting a liquid material according to claim 1, wherein the bank has a liquid-repellent surface.

5. The method for ejecting a liquid material according to claim 1, further comprising acquiring nozzle information on the landing positions of the individual nozzles by causing the droplets ejected through the plurality of nozzles positioned to face an ejection target for landing-state observation to land along a virtual straight line extending on the ejection target.

6. The method for ejecting a liquid material according to claim 5, wherein the nozzle information is acquired by causing the droplets to land along the virtual straight line while moving the plurality of nozzles and the ejection target relative to each other under the same conditions as those in the main scanning.

7. A method for manufacturing an organic electroluminescence device that includes a plurality of light-emitting-layer regions defined on a substrate, the light-emitting-layer regions having at least corresponding light-emitting layers provided thereon, the method comprising:

performing ejection in which a liquid material containing a light-emitting-layer material is ejected toward the light-emitting-layer regions by the method for ejecting a liquid material according to claim 1; and curing the ejected liquid material to obtain the light-emitting layers.

8. A method for manufacturing a color filter that includes a plurality of colored regions defined on a substrate, the colored regions having corresponding colored layers of at least three different colors provided thereon, the method comprising:

performing ejection in which liquid materials of at least three different colors containing corresponding colorants are ejected toward the colored regions by the method for ejecting a liquid material according to claim 1; and curing the ejected liquid materials to obtain the colored layers having the at least three different colors.

* * * * *